United States Patent
Kariya et al.

(10) Patent No.: US 9,497,849 B2
(45) Date of Patent: Nov. 15, 2016

(54) PRINTED WIRING BOARD

(71) Applicant: IBIDEN CO., LTD., Ogaki-shi (JP)

(72) Inventors: Takashi Kariya, Ogaki (JP); Toshiki Furutani, Ogaki (JP); Takeshi Furusawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 390 days.

(21) Appl. No.: 13/754,185

(22) Filed: Jan. 30, 2013

(65) Prior Publication Data

US 2014/0014399 A1 Jan. 16, 2014

Related U.S. Application Data

(60) Provisional application No. 61/669,874, filed on Jul. 10, 2012.

(51) Int. Cl.
*H05K 1/02* (2006.01)
*H05K 3/46* (2006.01)
(Continued)

(52) U.S. Cl.
CPC ............... *H05K 1/02* (2013.01); *H01L 21/486* (2013.01); *H01L 23/49827* (2013.01);
(Continued)

(58) Field of Classification Search
CPC ............. H01L 21/486; H01L 23/49827; H01L 23/49894; H01L 23/49816; H01L
(Continued)

(56) References Cited

U.S. PATENT DOCUMENTS

| | | | |
|---|---|---|---|
| 5,126,192 A * | 6/1992 | Chellis | C08J 5/24 361/748 |
| 2009/0229868 A1* | 9/2009 | Tsukada | H05K 3/4661 174/258 |

(Continued)

FOREIGN PATENT DOCUMENTS

| | | |
|---|---|---|
| JP | 2002-198650 | 7/2002 |
| JP | 2002-290046 A | 10/2002 |

(Continued)

*Primary Examiner* — Timothy Thompson
*Assistant Examiner* — Paul McGee, III
(74) *Attorney, Agent, or Firm* — Oblon, McClelland, Maier & Neustadt, L.L.P.

(57) ABSTRACT

A printed wiring board includes a core substrate, first and second buildup structures on surfaces of the core, respectively, and first and second solder-resist layers on the first and second structures, respectively. The core includes insulative substrate, conductive layers on surfaces of the substrate and through-hole conductor connecting the conductive layers, the first structure includes interlayer insulation layer and conductive layer in the first structure, the second structure includes interlayer insulation layer and conductive layer in the second structure, a thickness between the outer surfaces of the first and second solder-resist layers is set in range of from 150 μm or greater and less than 380 μm, and at least one of the core, first and second structures, and first and second solder-resist layers includes reinforcing material in amount such that the board includes the material in amount in range of from 20 to 35 vol. %.

20 Claims, 15 Drawing Sheets

(51) Int. Cl.
*H01L 21/48* (2006.01)
*H01L 23/498* (2006.01)

(52) U.S. Cl.
CPC ....... *H01L 23/49894* (2013.01); *H05K 3/4644* (2013.01); *H01L 23/49816* (2013.01); *H01L 23/49822* (2013.01); *H01L 2924/0002* (2013.01); *H05K 1/0271* (2013.01); *H05K 2201/029* (2013.01); *H05K 2201/09136* (2013.01)

(58) Field of Classification Search
CPC ................. 23/49822;H01L 2924/0002; H01L 2924/00; H05K 1/02; H05K 1/0271; H05K 3/4644; H05K 2201/029; H05K 2201/09136
USPC ............................... 174/262, 259, 260, 261
See application file for complete search history.

(56) References Cited

U.S. PATENT DOCUMENTS

| | | | | |
|---|---|---|---|---|
| 2011/0133342 A1* | 6/2011 | Arai | ................. | B81C 1/0023 257/774 |
| 2011/0147055 A1* | 6/2011 | Ma | ................. | H01L 21/4803 174/255 |

FOREIGN PATENT DOCUMENTS

| | | |
|---|---|---|
| JP | 2009-218545 A | 9/2009 |
| JP | 2009-280487 A | 12/2009 |

\* cited by examiner

FIG. 4
(A)
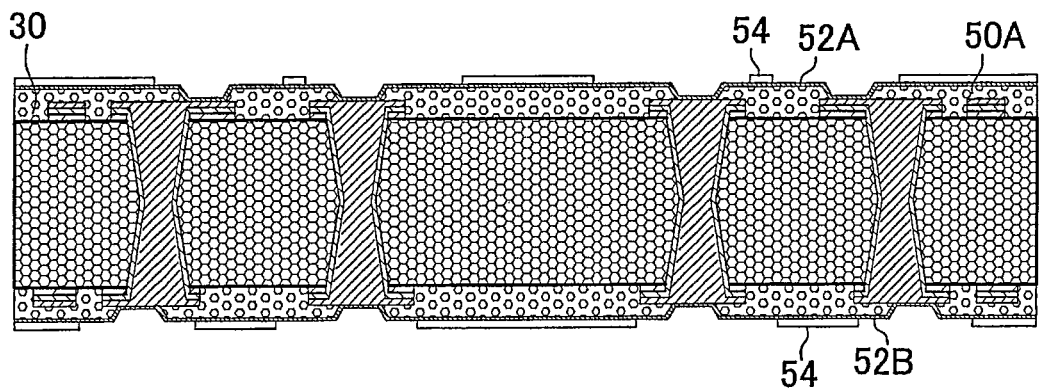
(B)
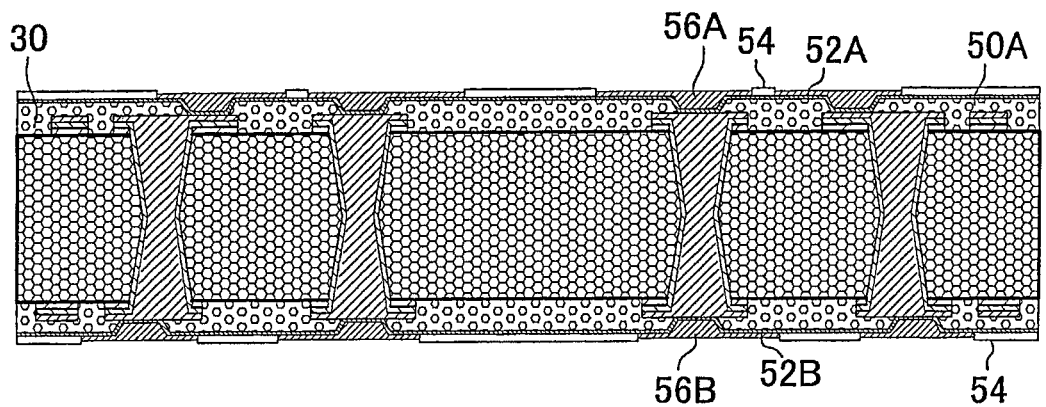

FIG. 11
(A)
Upper Solder-Resist Layer Side
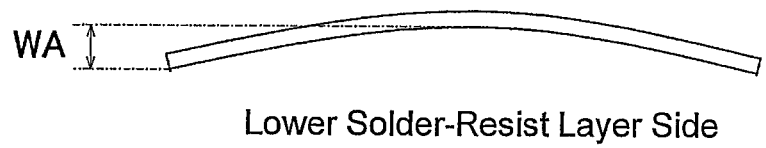
Lower Solder-Resist Layer Side
(B)
Upper Solder-Resist Layer Side
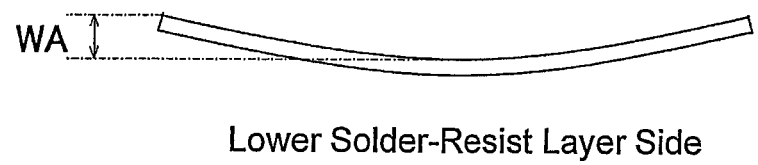
Lower Solder-Resist Layer Side

FIG. 13
(A)
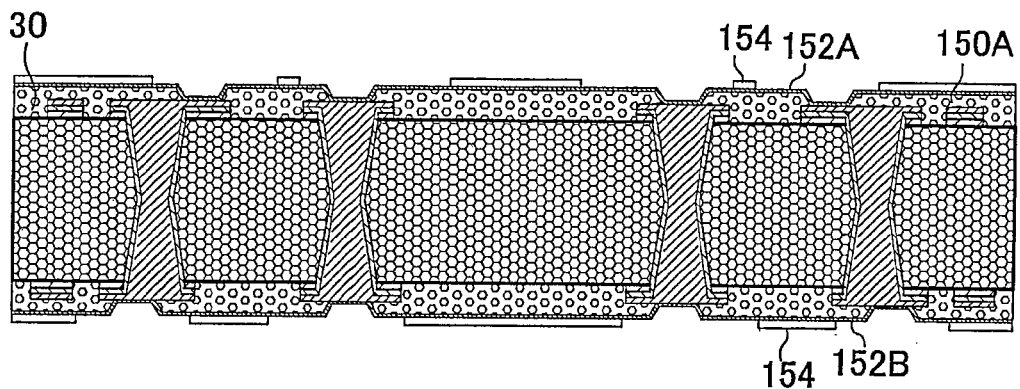
(B)
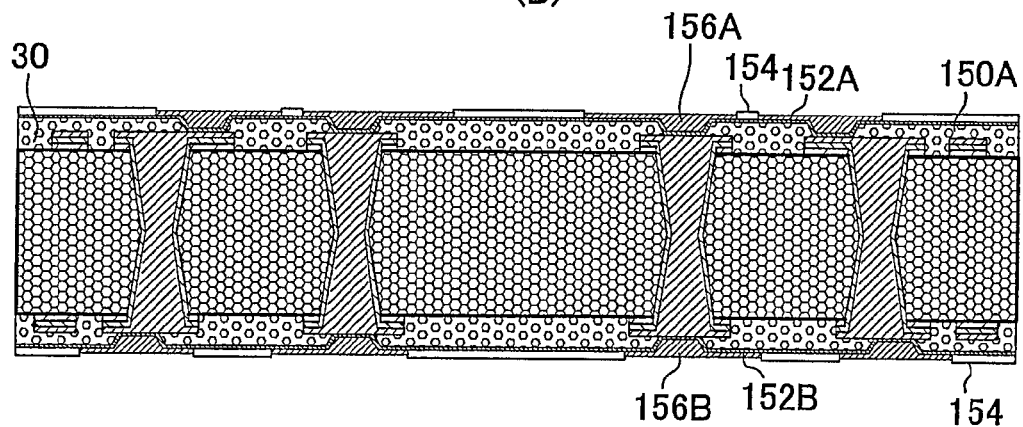
(C)
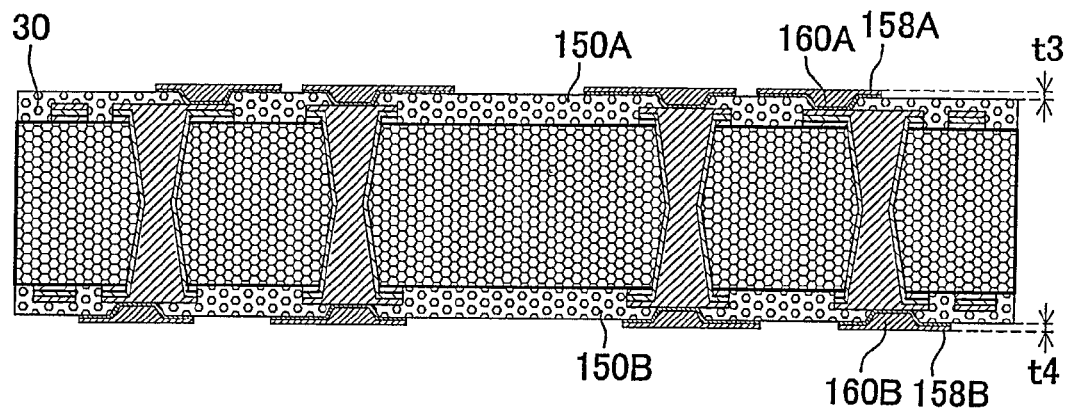

FIG. 14
(A)
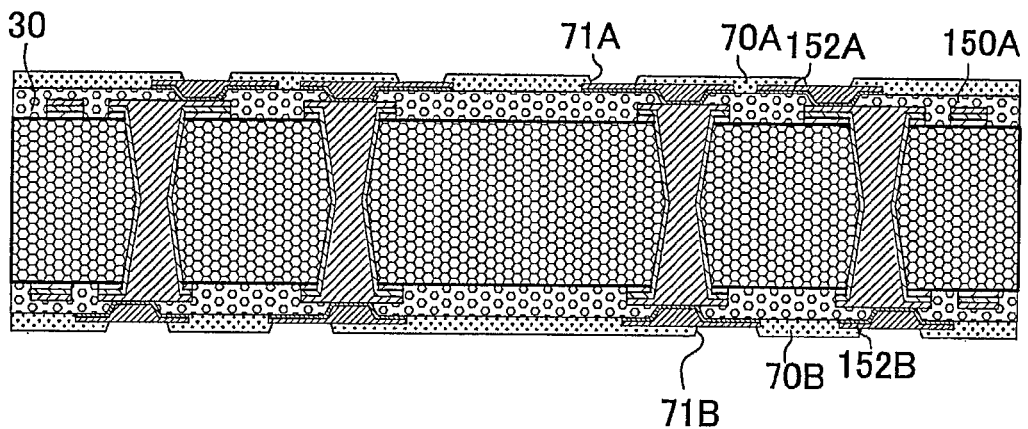
(B)
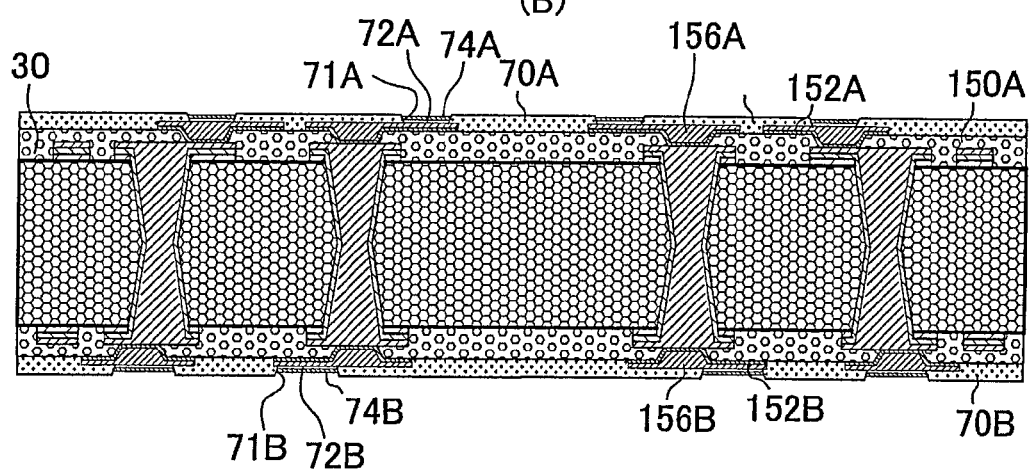
(C)
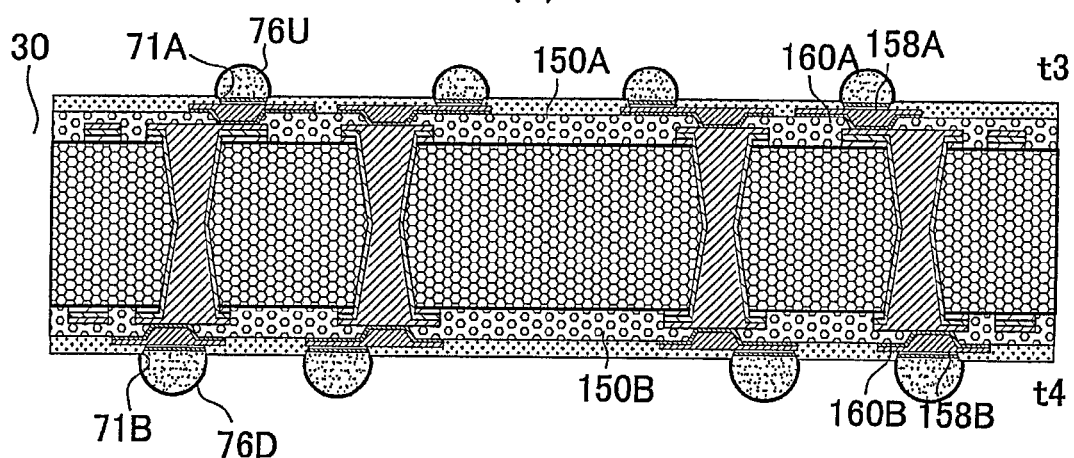

FIG. 15

| Examples | Amount of Warping | Direction of Warping |
|---|---|---|
| Example 1 | A | + |
| Example 4 | A | + |
| Example 7 | B | + |
| Example 10 | B | + |
| Example 13 | A | + and − coexist |
| Example 16 | A | + |
| Example 19 | A | + and − coexist |
| Example 22 | A | + and − coexist |
| Example 25 | A | + |
| Example 28 | A | + |
| Example 31 | B | + |
| Example 34 | A | + |
| Example 37 | A | + |
| Example 40 | A | + |
| Example 43 | A | + |
| Example 46 | A | + |

PRINTED WIRING BOARD

CROSS-REFERENCE TO RELATED APPLICATIONS

The present application is based upon and claims the benefit of priority from U.S. Application No. 61/669,874, filed Jul. 10, 2012, the entire contents of which are incorporated herein by reference.

BACKGROUND OF THE INVENTION

Field of the Invention

The present invention relates to a printed wiring board which has a core substrate, a buildup layer on the core substrate and a solder-resist layer on the buildup layer.

Description of Background Art

Japanese Laid-Open Patent Publication No. 2002-198650 describes a multilayer wiring board having a substrate body, and buildup layers on the substrate body. In Japanese Laid-Open Patent Publication No. 2002-198650, the thickness of the substrate body is set at less than 500 μm to reduce loop inductance. The entire contents of this publication are incorporated herein by reference.

SUMMARY OF THE INVENTION

According to one aspect of the present invention, a printed wiring board includes a core substrate, buildup structures including a first buildup structure formed on a first surface of the core substrate and a second buildup structure formed on a second surface of the core substrate on the opposite side of the first surface of the core substrate with respect to the first surface of the core substrate, and solder-resist layers including a first solder-resist layer formed on the first buildup structure and a second solder-resist layer formed on the second buildup structure. The core substrate includes an insulative substrate, a first conductive layer formed on a first surface of the insulative substrate, a second conductive layer formed on a second surface of the insulative substrate, and a through-hole conductor penetrating through the insulative substrate and connecting the first conductive layer and the second conductive layer, the first buildup structure includes an interlayer resin insulation layer and a conductive layer formed on the interlayer resin insulation layer in the first buildup structure, the second buildup structure includes an interlayer resin insulation layer and a conductive layer formed on the interlayer resin insulation layer in the second buildup structure, a thickness between an outer surface of the first solder-resist layer and an outer surface of the second solder-resist layer is set in a range of from 150 μm or greater and less than 380 μm, and at least one of the core substrate, the first buildup structure, the second buildup structure, the first solder-resist layer and the second solder-resist layer includes a reinforcing material in an amount such that the printed wiring board includes the reinforcing material in an amount in a range of from 20 vol. % to 35 vol. %.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-(B) are views showing steps of a method for manufacturing a printed wiring board according to the embodiment;

FIGS. 11(A)-(B) are examples of warping of a printed wiring board;

FIGS. 13(A)-(C) are views showing steps of a method for manufacturing a printed wiring board in Example 1;

FIGS. 14(A)-(C) are views showing steps of a method for manufacturing a printed wiring board in Example 1; and FIG. 15 is a table showing amounts of warping and directions of warping of printed wiring boards in examples.

DETAILED DESCRIPTION OF THE EMBODIMENTS

Figure 1:
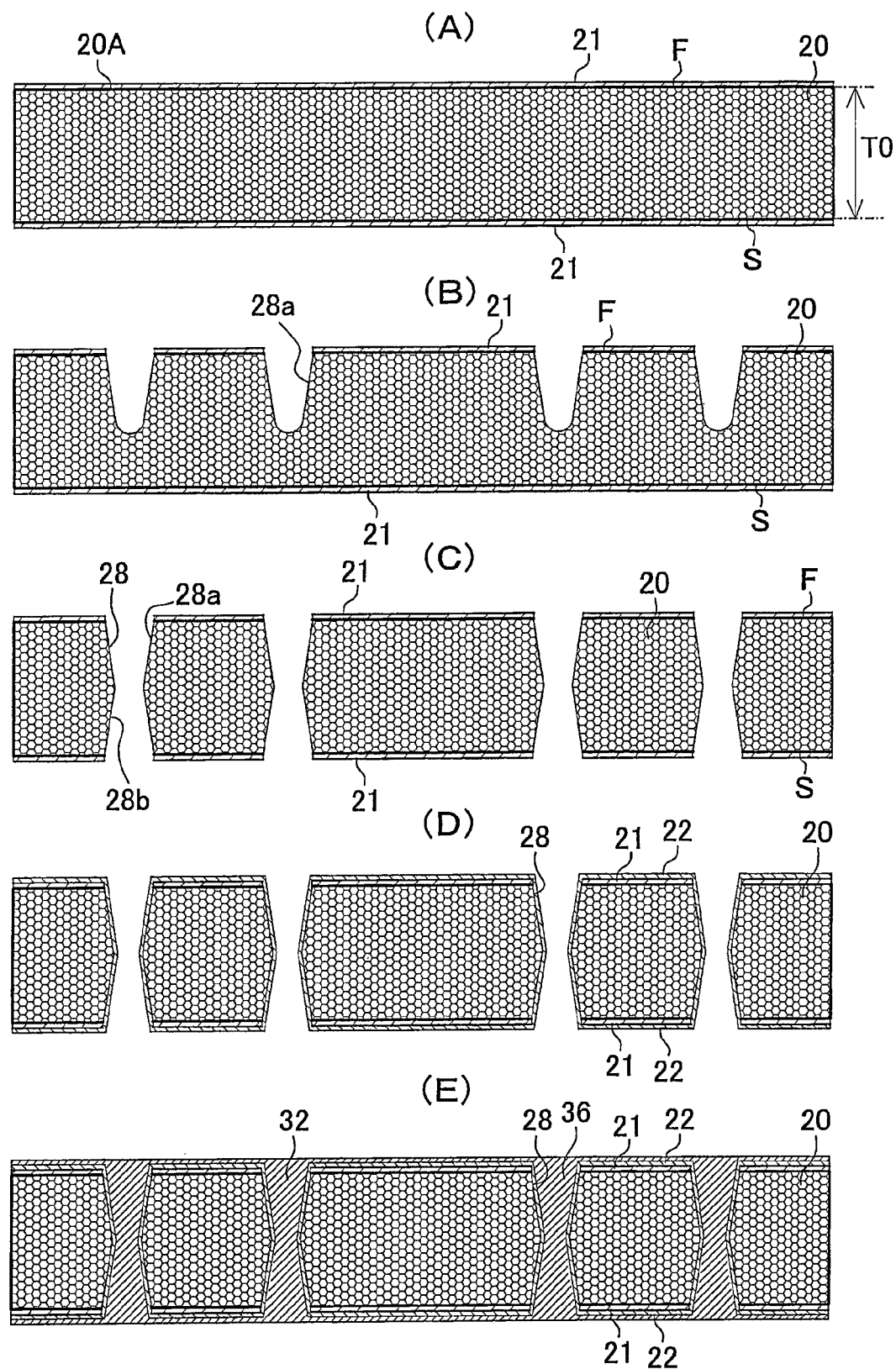
FIGS. 1(A)-(E) are views showing steps of a method for manufacturing a printed wiring board according to an embodiment of the present invention.

The embodiments will now be described with reference to the accompanying drawings, wherein like reference numerals designate corresponding or identical elements throughout the various drawings.

Figure 7:
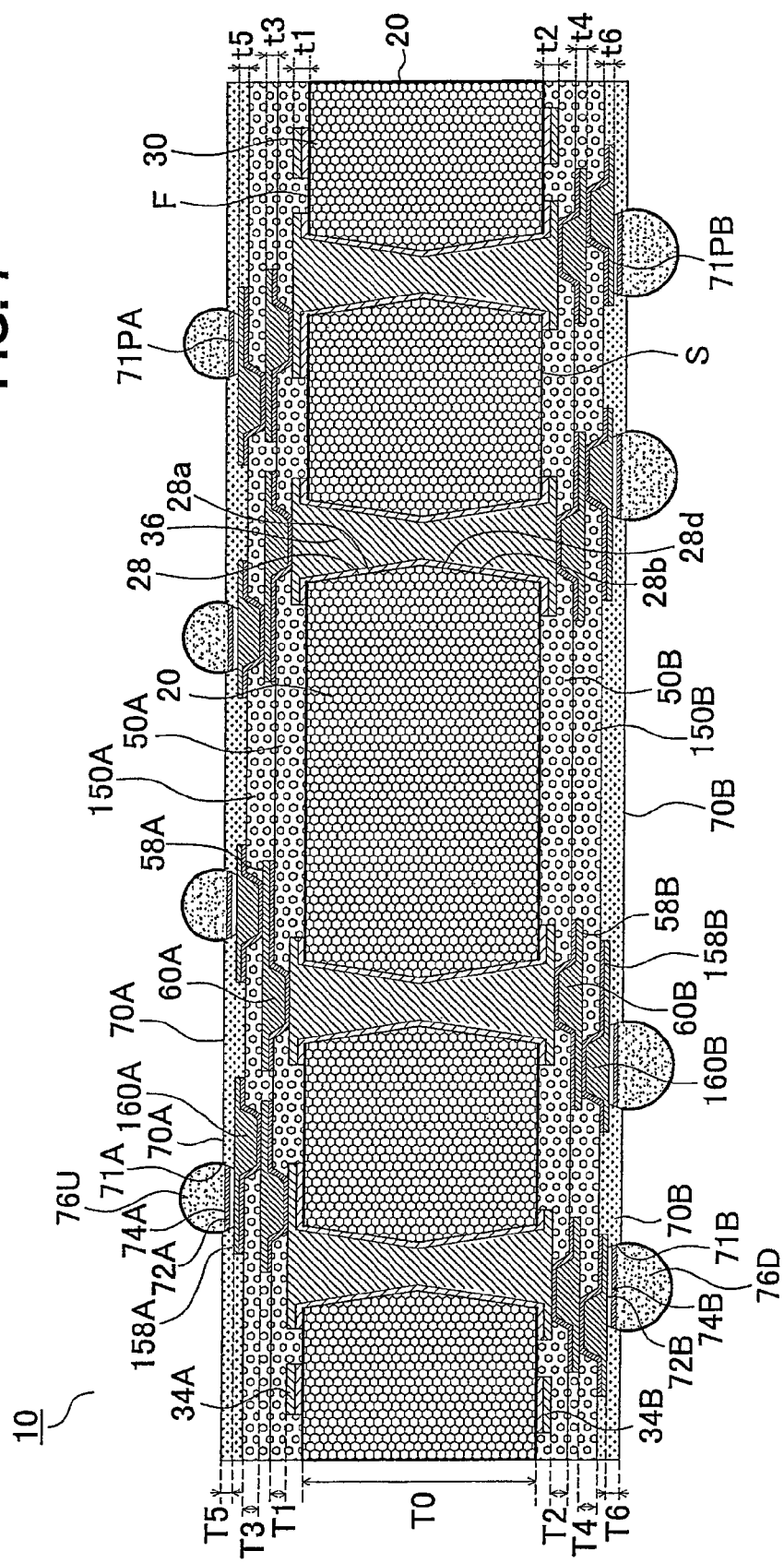
FIG. 7 is a cross-sectional view of a printed wiring board according to the embodiment.

FIG. 7 shows a cross-sectional view of printed wiring board 10 according to an embodiment of the present invention. Printed wiring board 10 of the embodiment has core substrate 30 which is formed with insulative substrate 20 having first surface (F) and second surface (S) opposite the first surface, first conductive layer (34A) formed on the first surface of the insulative substrate, second conductive layer (34B) formed on second surface (S), and through-hole conductors 36 connecting first conductive layer (34A) and second conductive layer (34B). Thickness (t1, t2) of the first conductive layer and the second conductive layer of the core substrate is 5 μm to 13 μm. The printed wiring board is made thinner. Such thickness is preferred to be 10 μm or less. Warping of the printed wiring board is reduced.

The insulative substrate contains reinforcing material such as glass cloth or organic fiber. The thermal expansion coefficient of the reinforcing material is preferred to be 6 ppm or lower. When an IC chip is mounted on printed wiring board 10, and the printed wiring board with an IC chip is mounted on a motherboard (second mounting), warping is reduced. The amount (vol. %) of the reinforcing material contained in the insulative substrate is 22 vol. % to 92 vol. %. Thickness (T0) of the insulative substrate is 75 μm to 290 μm. Warping of the printed wiring board is reduced even if the printed wiring board is thin. The thickness of the insulative substrate is preferred to be 200 μm. Even if the thickness of a printed wiring board is 300 μm or less, a thin printed wiring board with less warping is obtained.

Upper buildup layers are formed on first surface (F) of core substrate 30 and on first conductive layer (34A). The upper buildup layers include at least uppermost interlayer resin insulation layer (150A), uppermost conductive layer (158A) on the uppermost interlayer resin insulation layer, and uppermost via conductors (160A) penetrating through the uppermost interlayer resin insulation layer and electrically connecting the uppermost conductive layer and the first conductive layer of the core substrate. The upper buildup layers may include upper interlayer resin insulation layer (50A) between the uppermost interlayer resin insulation layer and the core substrate, upper conductive layer (58A) on the upper interlayer resin insulation layer, and upper via conductors (60A) penetrating through the upper interlayer resin insulation layer and connecting the upper conductive layer and the first conductive layer.

Lower buildup layers are formed on second surface (S) of core substrate 30. The lower buildup layers include at least lowermost interlayer resin insulation layer (150B), lowermost conductive layer (158B) on the lowermost interlayer resin insulation layer, and lowermost via conductors (160B) penetrating through the lowermost interlayer resin insulation layer and electrically connecting the lowermost conductive layer and the second conductive layer of the core substrate. The lower buildup layers may include lower interlayer resin insulation layer (50B) between the lowermost interlayer resin insulation layer and the core substrate, lower conductive layer (58B) on the lower interlayer resin insulation layer, and lower via conductors (60B) penetrating through the lower interlayer resin insulation layer and connecting the lower conductive layer and the second conductive layer. The first surface of the core substrate corresponds to the first surface of the insulative substrate, and the second surface of the core substrate corresponds to the second surface of the insulative substrate. The upper and lower buildup layers are preferred to be formed with two interlayer resin insulation layers and two conductive layers. A thin printed wiring board with less warping is obtained, allowing a highly functional IC chip to be mounted.

Figure 8:
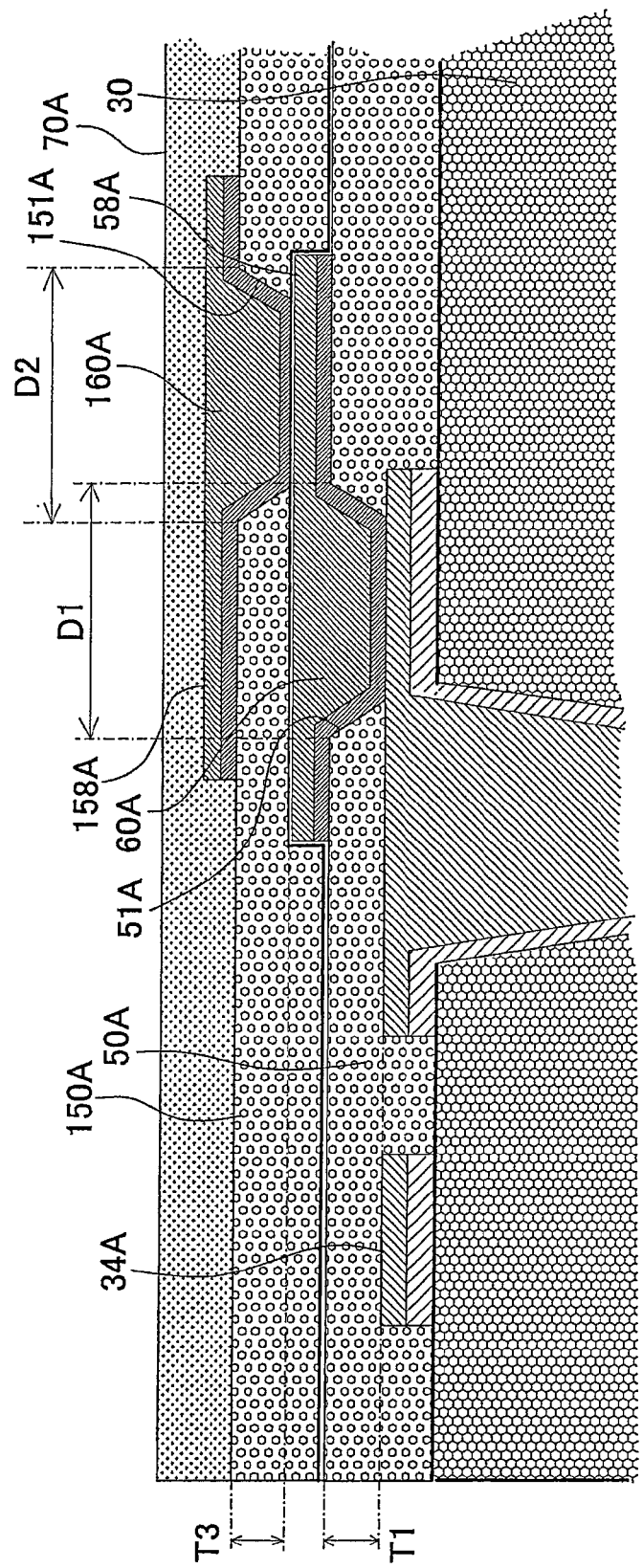
FIG. 8 is a view showing thicknesses of interlayer resin insulation layers and opening diameters.

The interlayer resin insulation layers in the upper and lower buildup layers are preferred not to contain reinforcing material. Thicknesses of the interlayer resin insulation layers are reduced. Since sizes of via-conductor openings decrease, the numbers of interlayer resin insulation layers and conductive layers in the buildup layers are decreased. Thicknesses of the interlayer resin insulation layers in the upper and lower buildup layers are 5~20 μm. Thicknesses (T1, T2, T3, T4) of interlayer resin insulation layers are each the distance from the upper surface of a conductive layer covered by their respective interlayer resin insulation layer to the upper surface of that interlayer resin insulation layer (FIGS. 7 and 8). In FIG. 7, (T1, T2, T3, T4) indicate thicknesses of the interlayer resin insulation layers, and (T5, T6) indicate thicknesses of the solder-resist layers. Since the interlayer resin insulation layers are thin, the ratio of the core substrate that occupies the printed wiring board is great. Even if the insulative substrate is made thin and the interlayer resin insulation layers do not contain reinforcing material, the strength of the printed wiring board is increased and warping is reduced. Thicknesses of the interlayer resin insulation layers are preferred to be 13 μm or less. The thickness of the printed wiring board is set to be less than 380 μm. When a printed wiring board is thin, warping of the printed wiring board is controlled by reinforcing material. Warping of printed wiring boards is less likely to vary. Connection reliability is enhanced between an IC chip and a printed wiring board and between the printed wiring board and a motherboard.

When interlayer resin insulation layers do not contain reinforcing material and their thicknesses are from 5 μm to 20 μm, diameters (D1, D2) of via-conductor openings (51A, 151A) are set to be 30 μm to 55 μm (FIG. 8). The diameter of a via-conductor opening is measured on the upper surface of an interlayer resin insulation layer (FIG. 8). The opening diameter is measured on the interface between the upper surface of an interlayer resin insulation layer and the conductive layer on the upper surface of that interlayer resin insulation layer (FIG. 8). Interlayer resin insulation layers in the upper and lower buildup layers may contain inorganic particles made of glass or the like to reduce their thermal expansion coefficients. Thicknesses of the conductive layers in the upper and lower buildup layers are 5 μm to 13 μm. The thickness of a printed wiring board is set to be less than 380 μm. Thicknesses of the conductive layers are preferred to be 10 μm or less. It is difficult to set volumes of the conductive layers to be the same on the upper and lower sides of the core substrate. When the conductive layers are made thin, warping of the printed wiring board is less even if the volumes of the conductive layers are different on the upper and lower sides of the core substrate.

Upper solder-resist layer (70A) is formed on the upper buildup layers, and lower solder-resist layer (70B) is formed on the lower buildup layers. Solder-resist layer (70A) includes openings (71A) to expose the uppermost conductive layer or uppermost via conductors, and solder-resist layer (70B) includes openings (71B) to expose the lowermost conductive layer or lowermost via conductors. Conductor portions exposed through such openings work as pads (71PA, 71PB). Solder bumps (76U, 76D) are formed respectively on those pads. Thicknesses (T5, T6) of upper and lower solder-resist layers are 5 μm to 15 μm. The thickness of a printed wiring board is reduced. The solder-resist layers do not contain reinforcing material such as glass cloth. Thicknesses of the solder-resist layers are each the distance from the upper surface of a conductive layer to the upper surface of the solder-resist layer as shown in FIG. 7.

Figure 9:
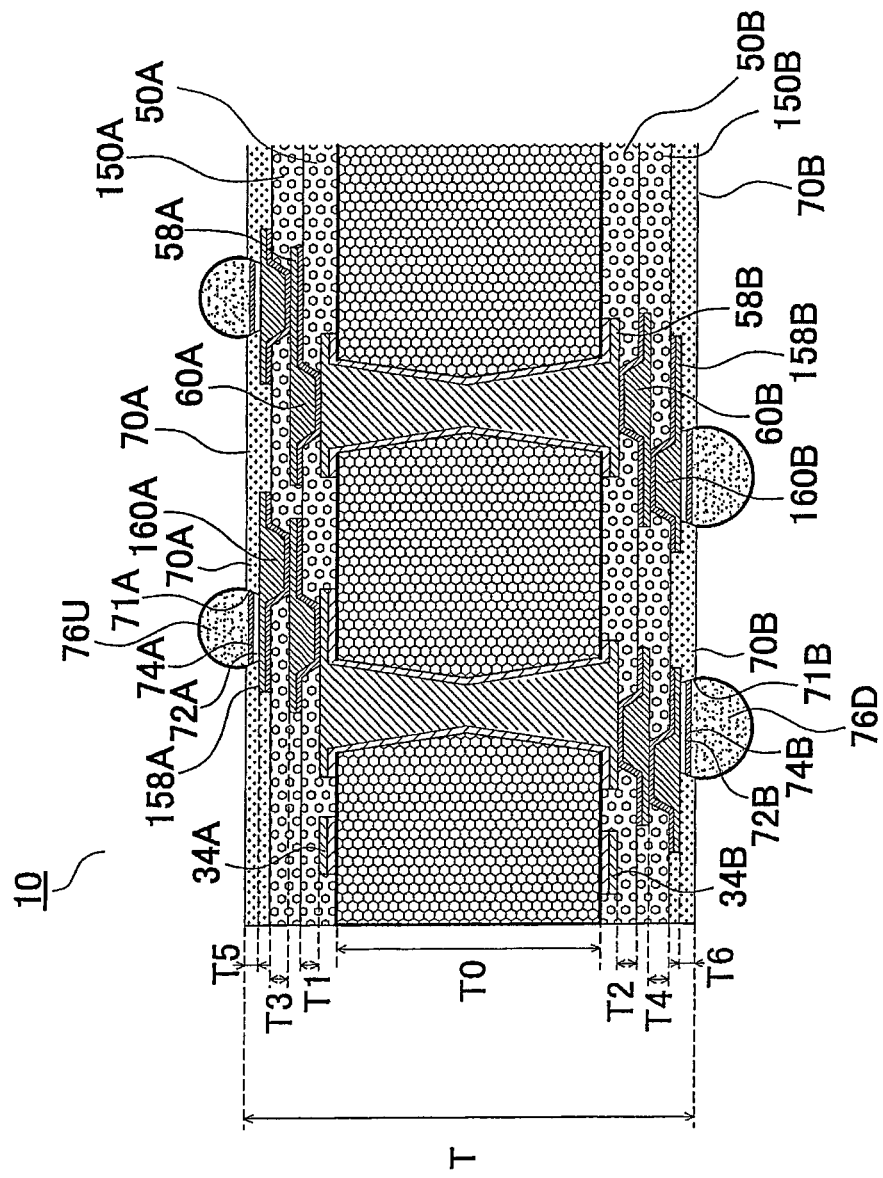
FIG. 9 is a view showing thicknesses in the printed wiring board.

In a printed wiring board according to the embodiment, the thickness of a printed wiring board is 150 μm or greater but less than 380 μm. The printed wiring board is thin. Thickness (T) of the printed wiring board is the distance from the upper surface of the upper solder-resist layer to the upper surface of the lower solder-resist layer as shown in FIG. 9. A printed wiring board of the embodiment is made thin. The amount (vol. %) of reinforcing material such as glass cloth contained in the printed wiring board is 20 vol. % to 35 vol. %. Thus, the strength of the printed wiring board is high. In addition, it is easy to form penetrating holes for through-hole conductors and via-conductor openings. Thus, penetrating holes for through-hole conductors and via-conductor openings are made smaller, resulting in a thinner and smaller printed wiring board. Warping of the printed wiring board is less. When a printed wiring board warps or the like, the thickness of the printed wiring board is defined by the following value. Distances from the upper surface of the upper solder-resist layer to the upper surface of the lower solder-resist layer are measured along a diagonal line of a printed wiring board. Among the distances, the maximum value is set as the thickness of the printed wiring board. When the thickness of a printed wiring board is less than 380 μm, the printed wiring board is thin, and the rigidity of the printed wiring board is low. When the rigidity of a printed wiring board is low, it is easy to control the direction of warping of the printed wiring board using reinforcing material. When the amount of reinforcing material contained in a printed wiring board is 20 vol. % to 35 vol. %, the direction of warping is the same in each printed wiring board. When multiple printed wiring boards are manufactured at the same time, even if each printed wiring board warps, each printed wiring board warps in a direction as shown in FIG. 11(A), for example. Accordingly, the yield is high when mounting a semiconductor element on a printed wiring board of the embodiment. The yield in the second mounting is high. Connection reliability is high between an IC chip and a printed wiring board and between the printed wiring board and a motherboard.

Interlayer resin insulation layers in the buildup layers and solder-resist layers do not contain reinforcing material, and only the core substrate contains reinforcing material. Since thicknesses of the conductive layers, interlayer resin insulation layers and solder-resist layers are small as described above in the embodiment, the ratio of the thickness of the insulative substrate to the thickness of the printed wiring board is great. Thin buildup layers and solder resist are laminated on both surfaces of the thick and strong insulative substrate. Warping of the printed wiring board is reduced. When the upper and lower buildup layers are formed with one interlayer resin insulation layer and one conductive layer, value (x) obtained by dividing the thickness of the insulative substrate by the thickness of the printed wiring board is 2/3 or greater but 3/4 or less. When the upper and lower buildup layers are formed with two interlayer resin insulation layers and two conductive layers, value (x) above is 1/2 or greater but 2/3 or less. Since value (x) exists in a predetermined range, warping during the second mounting is reduced. When multiple printed wiring boards are manufactured at the same time, each printed wiring board shows the same warping. For example, warping occurs in a printed wiring board in such a way that the upper solder-resist side becomes convex (FIG. 11(A)). Accordingly, the mounting yield of the second mounting improves.

In a printed wiring board of the embodiment, interlayer resin insulation layers are made thin and do not contain reinforcing material. Thus, fine conductive circuits are formed in conductive layers of the buildup layers. For example, a printed wiring board is manufactured to have wiring lines of 8 μm/8 μm (line width/space width). Since a printed wiring board is made smaller, its warping is reduced.

Also, in a printed wiring board of the embodiment, when the thickness of a conductive layer is divided by the thickness of an interlayer resin insulation layer, the obtained value is 0.5~0.9. The thickness of the printed wiring board is set to be less than 380 μm. In addition, insulation reliability increases between conductive layers formed in different layers.

In a printed wiring board of the embodiment, when the thickness of a solder-resist layer is divided by the thickness of an interlayer resin insulation layer, the obtained value is 0.9~1.1. Since thicknesses of solder-resist layers and thicknesses of interlayer resin insulation layers are substantially the same, warping is reduced.

Figure 10:
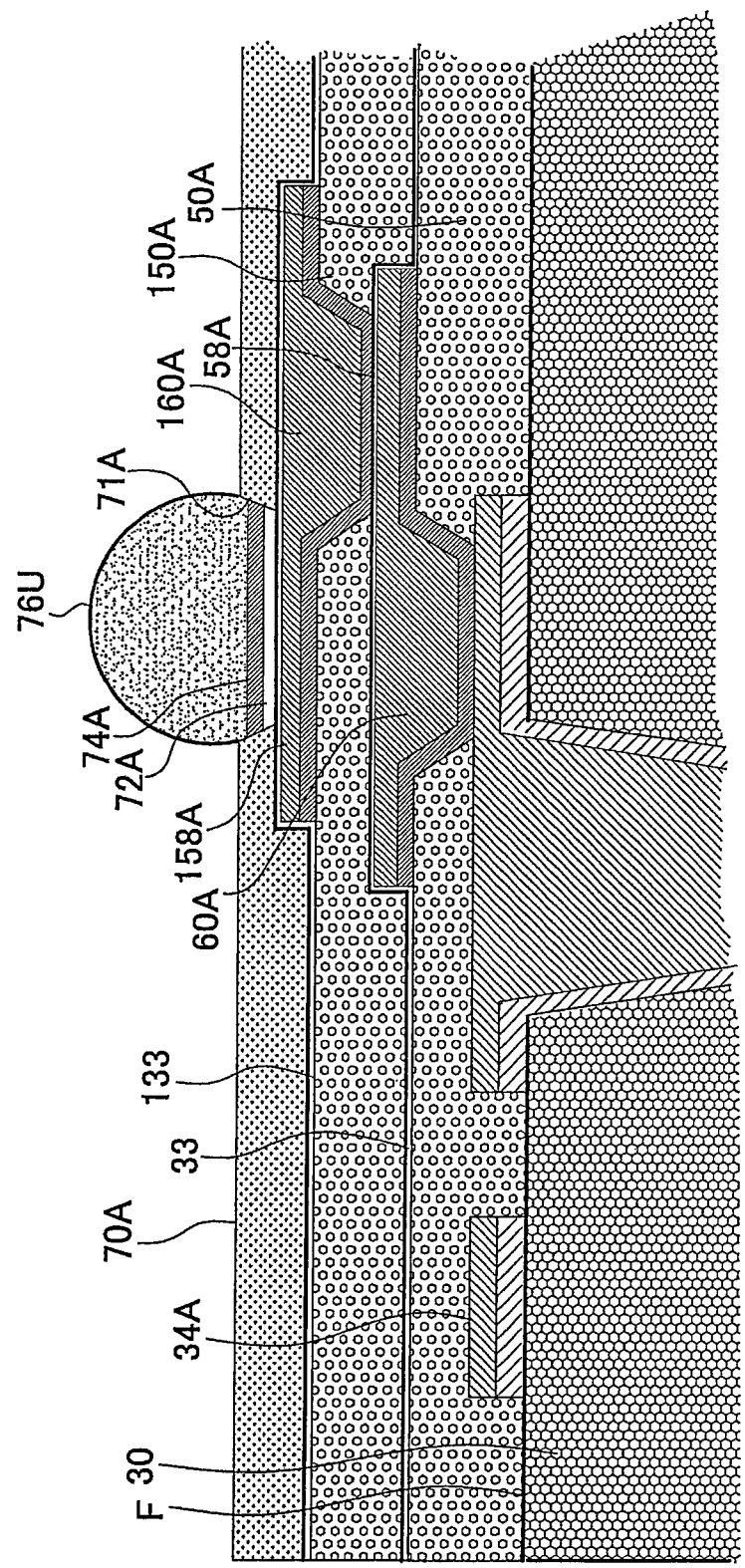
FIG. 10 is a view showing a covering film.

Insulative covering films may be formed on the insulative substrate, conductive layers on the insulative substrate, and through-hole conductors so that they are covered. In the same manner, covering films (33, 133) may be formed on interlayer resin insulation layers, conductive layers on the interlayer resin insulation layers, and via conductors so that they are covered (FIG. 10). Thicknesses of the covering films are 0.1~1 μm. Such covering films are formed by sputtering, vacuum deposition or the like. Even if interlayer resin insulation layers are made thin, insulation reliability increases by using covering films.

The following describes a method for manufacturing printed wiring board 10.

(1) Double-sided copper-clad laminate (20A) is prepared (FIG. 1(A)). The double-sided copper-clad laminate contains reinforcing material and resin. Thickness (T0) of insulative substrate 20 is 75 μm to 290 μm, and the percentage of the volume (vol. %) of reinforcing material that occupies the volume of the insulative substrate is 22 vol. % to 92 vol. %. Reinforcing materials such as glass cloth, aramid fiber, glass fiber or organic fiber may be used. Glass cloth is preferred. In addition to resin and reinforcing material, the insulative substrate is preferred to contain inorganic particles made of glass, for example. Examples of other inorganic particles are those made of hydroxides. Metal hydroxides such as aluminum hydroxide, magnesium hydroxide, calcium hydroxide or barium hydroxide may be used. Water is produced when hydroxides are thermally decomposed. Thus, it is thought that hydroxides can rob heat from the material forming the insulative substrate. Namely, when the insulative substrate contains a hydroxide, the quality of laser processing is thought to be enhanced.

(2) Using a CO2 laser from the first-surface (F) (upper-surface) side of insulative substrate 20, first openings (28a) are formed on the first-surface (F) side of insulative substrate 20 (FIG. 1(B)).

(3) Using a CO2 laser from the second-surface (S) (lower-surface) side of insulative substrate 20, second openings (28b) are formed on the second-surface (S) side of the core substrate (FIG. 1(C)). Penetrating holes 28 are formed by connecting first openings (28a) and second openings (28b) in the core substrate.

Next, insulative substrate 20 having penetrating holes 28 is immersed in a solution containing permanganic acid at a predetermined concentration to conduct a desmearing treatment. At that time, the amount of weight reduction of insulative substrate 20 is preferred to be 1.0 wt. % or lower, more preferably 0.5 wt. % or lower. When resin is dissolved through a desmearing treatment, glass cloth protrudes into the penetrating holes. When the amount of weight reduction of the insulative substrate is in the above range, protrusion of glass cloth is suppressed. As a result, when the penetrating holes are filled with plating, voids seldom occur in the plated film.

(4) A catalyst is attached to surfaces of insulative substrate 20. Then, insulative substrate 20 is immersed in an electroless plating solution to form electroless plated films 22 on first surface (F) and second surface (S) of insulative substrate 20 and on the inner walls of penetrating holes 28 (FIG. 1(D)). Copper, nickel or the like is listed as the material for forming electroless plated films 22. Using the electroless plated films as seed layers, electrolytic plated films 32 are formed on electroless plated films 22. Penetrating holes 28 are filled with electrolytic plated film (FIG. 1(E)).

Figure 2:
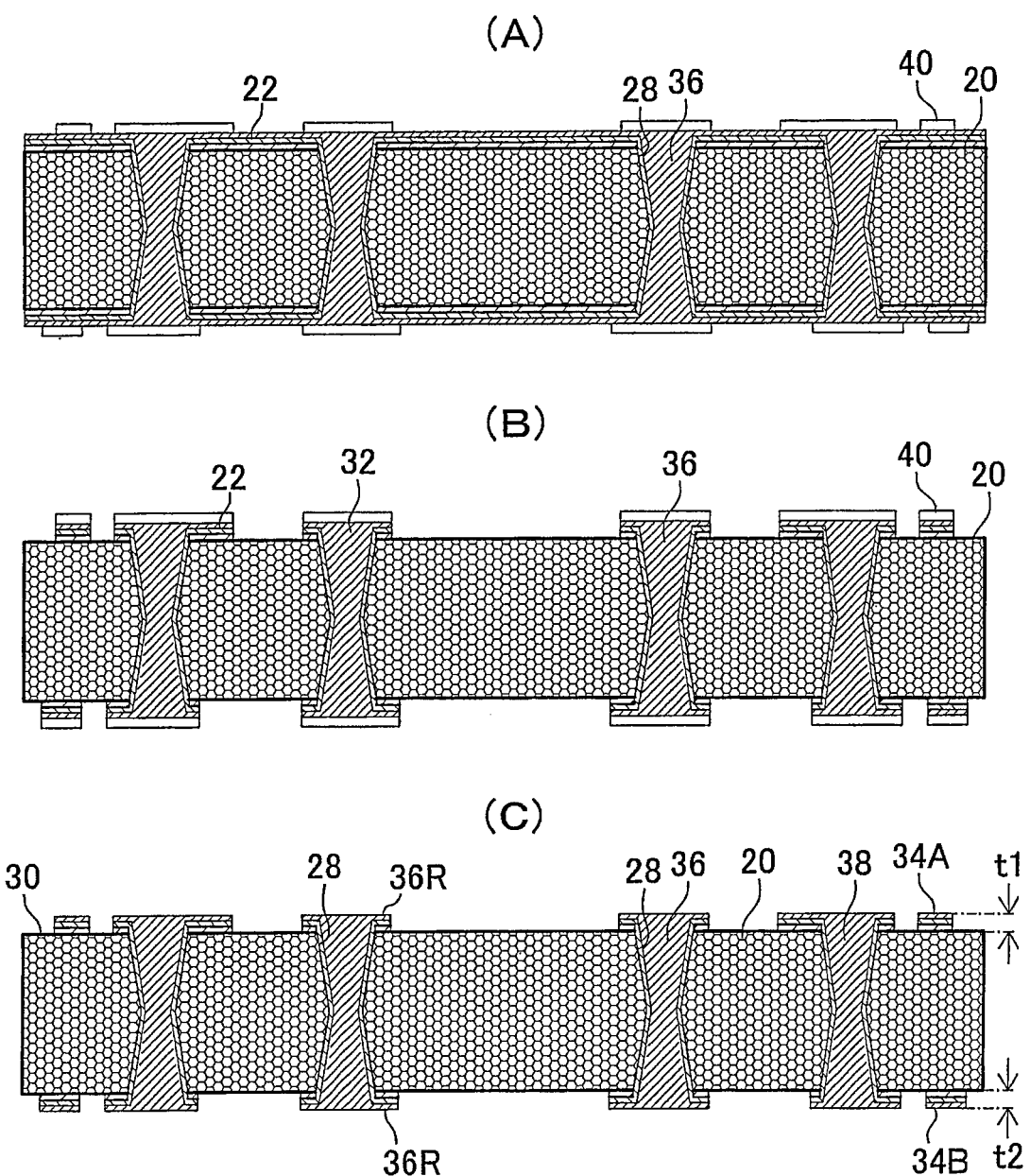
FIGS. 2(A)-(C) are views showing steps of a method for manufacturing a printed wiring board according to the embodiment.

(5) Etching resists 40 with a predetermined pattern are formed on electrolytic plated films 32 (FIG. 2(A)).

(6) Electroless plated films 22, electrolytic plated films 32 and metal foils 21 exposed from etching resists 40 are removed (FIG. 2(B)).

(7) Etching resists 40 are removed. Accordingly, first conductive layer (34A) is formed on first surface (F) of insulative substrate 20, and second conductive layer (34B) is formed on second surface (S) of insulative substrate 20 (FIG. 2(C)). First conductive layer (34A) and second conductive layer (34B) are connected by through-hole conductors 36 in penetrating holes 28. Core substrate 30 is completed.

(8) Thicknesses (t1, t2) of first conductive layer (34A) and second conductive layer (34B) are 5 μm to 13 μm (FIG. 2(C)). First and second conductive layers include lands (36R) of through-hole conductors.

Figure 3:
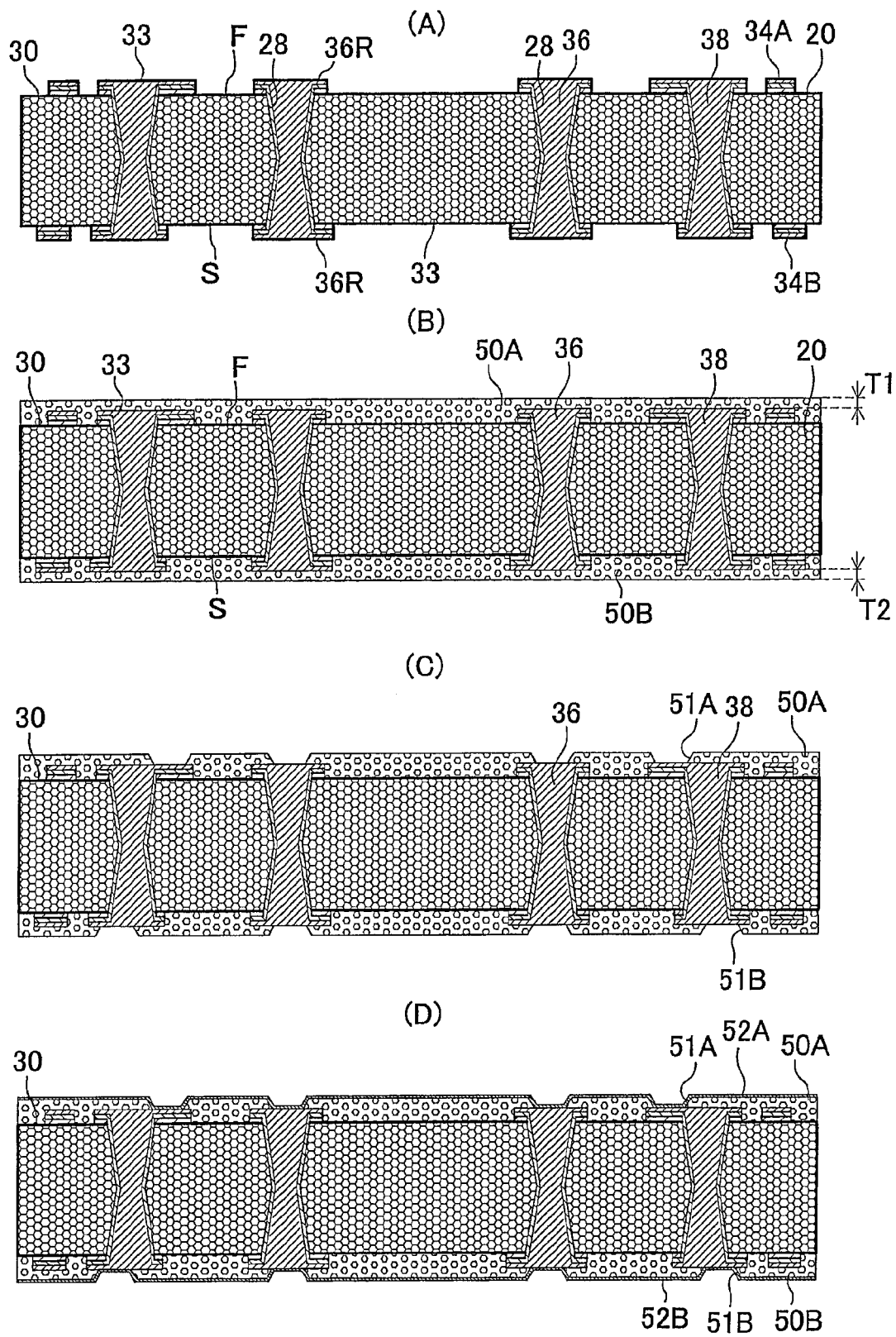
FIGS. 3(A)-(D) are views showing steps of a method for manufacturing a printed wiring board according to the embodiment.

(9) Covering film 33 made by sputtering SiN is formed on first surface (F) of insulative substrate 20, first conductive layer (34A) and through-hole conductors. In the same manner, covering film 33 is formed on second surface (S) of insulative substrate 20, second conductive layer (34B) and through-hole conductors (FIG. 3(A)). It is an option not to form such covering films. Manufacturing costs decrease.

(10) Upper and lower interlayer resin insulation layers (50A, 50B) are formed on both surfaces (F, S) of core substrate 30 through a layer of covering film 33 (FIG. 3(B)). Thicknesses (T1, T2) of interlayer resin insulation layers are 5 μm to 20 μm. Upper and lower interlayer resin insulation layers contain inorganic particles but not reinforcing material.

(11) Next, using a CO2 gas laser, via-conductor openings (51A, 51B) are respectively formed in interlayer resin insulation layers (50A, 50B) (FIG. 3(C)). Sizes of via-conductor openings (51A, 51B) are 30 μm to 55 μm (FIG. 9). Covering films formed on upper surfaces of the conductive layers exposed through openings (51A, 51B) are removed by etching or the like. Connection reliability is enhanced.

(12) Electroless plated films (52A, 52B) are formed on interlayer resin insulation layers (50A, 50B) and in openings (51A, 51B) (FIG. 3(D)).

(13) Plating resists 54 are formed on electroless plated films 52 (FIG. 4(A)).

(14) Electrolytic plated films (56A, 56B) are formed on electroless plated films 52 exposed from plating resists 54 (FIG. 4(B)).

Figure 5:
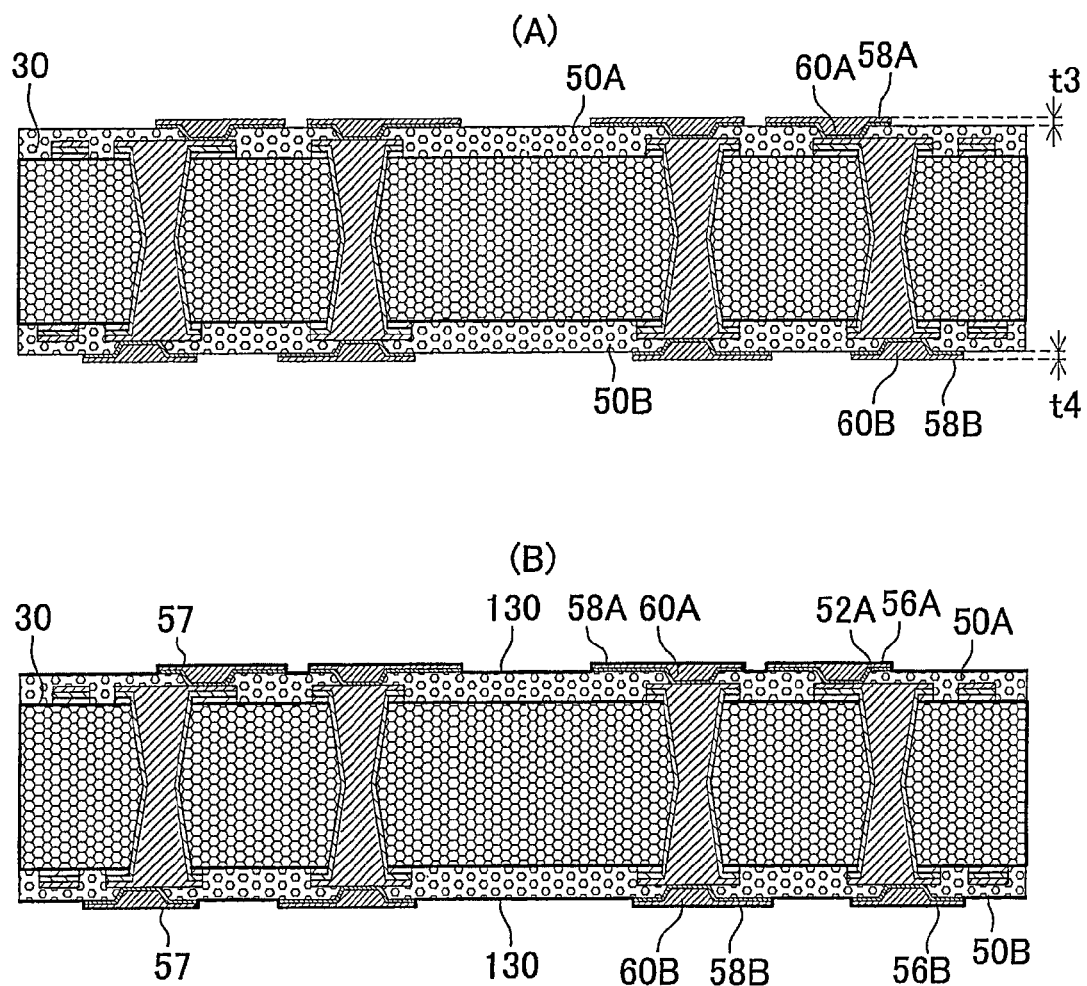
FIGS. 5(A)-(B) are views showing steps of a method for manufacturing a printed wiring board according to the embodiment.

(15) Plating resists 54 are removed. Upper and lower conductive layers (58A, 58B) and upper and lower via conductors (60A, 60B) are formed by etching away electroless plated films between portions of electrolytic plated films (FIG. 5(A)). Thicknesses of upper and lower conductive layers (58A, 58B) are 5 μm to 13 μm (FIG. 5(A)). Since interlayer resin insulation layers are made thin, fine openings are formed in the interlayer resin insulation layers. Also, since via-conductor openings are small, the openings are filled with plated film even if the conductive layers are made thin. Even if thicknesses of conductive layers are 5 μm to 13 μm, filled vias are formed in the openings. Even if thicknesses of conductive layers are 10 μm or less, upper surfaces of via conductors are made flat.

(16) The same as in step (9) above, covering film 130 made of SiN is formed on upper interlayer resin insulation layer (50A), upper conductive layer (58A) and upper via conductors. Covering film 130 made of SiN is formed on lower interlayer resin insulation layer (50B), lower conductive layer (58B) and lower via conductors (FIG. 5(B)). Even if interlayer resin insulation layers are made thin, interlayer insulation reliability is enhanced by the covering films.

Figure 6:
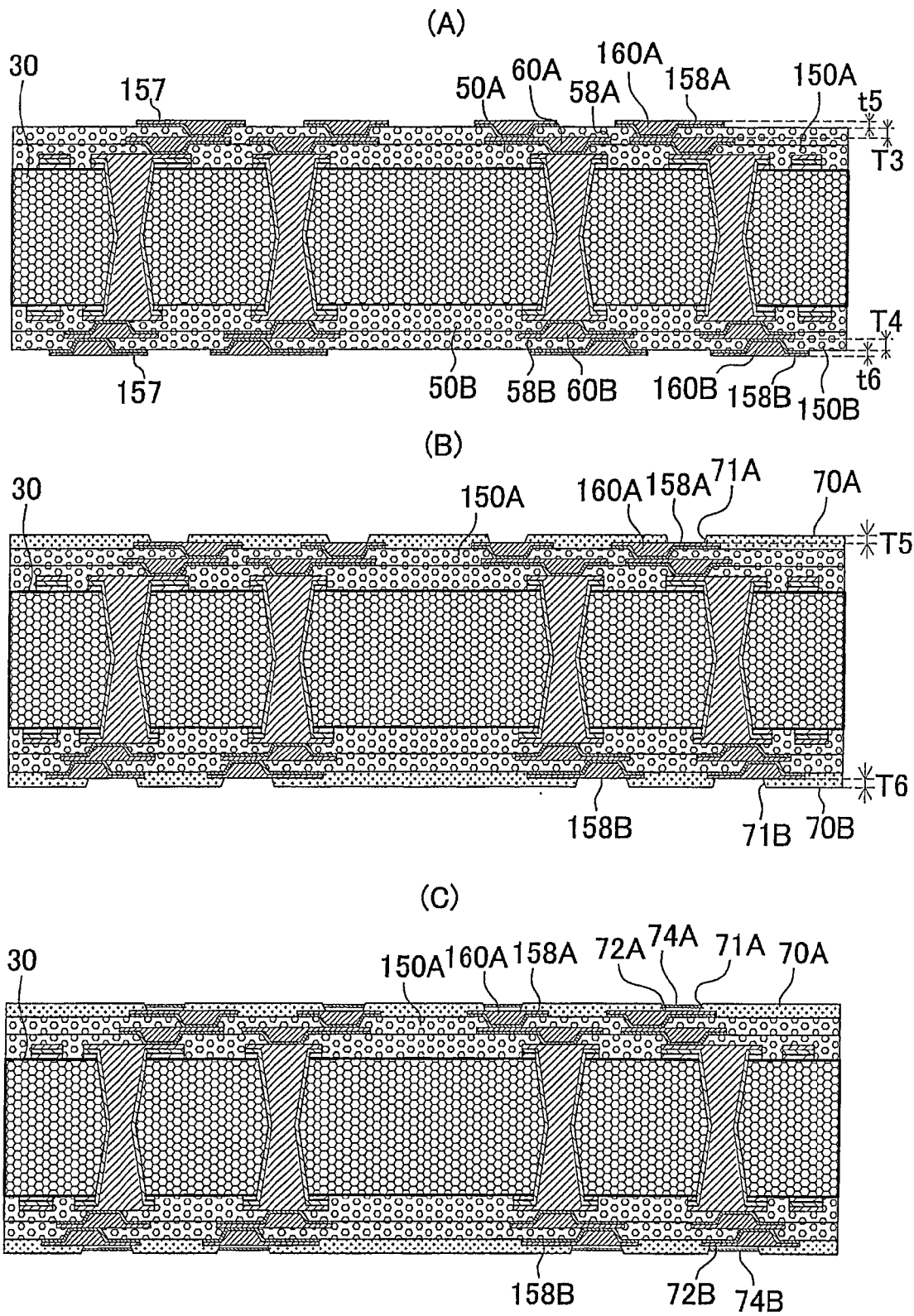
FIGS. 6(A)-(C) are views showing steps of a method for manufacturing a printed wiring board according to the embodiment.

(17) Next, steps the same as (10)~(15) above are repeated to form upper and lower buildup layers (FIG. 6(A)). An uppermost interlayer resin insulation layer is formed on the upper interlayer resin insulation layer, upper conductive layer and upper via conductors through a layer of covering film 130. Likewise, a lowermost interlayer resin insulation layer is formed on the lower interlayer resin insulation layer, lower conductive layer and lower via conductors through a layer of covering film. Thicknesses of uppermost and lowermost interlayer resin insulation layers are 5 μm to 20 μm. The uppermost and lowermost interlayer resin insulation layers contain inorganic particles but not reinforcing material.

An uppermost conductive layer is formed on the uppermost interlayer resin insulation layer. A lowermost conductive layer is formed on the lowermost interlayer resin insulation layer. Thicknesses of uppermost and lowermost conductive layers are 5 μm to 13 μm. Thicknesses of conductive layers are adjustable by etching.

Uppermost via conductors are formed in the uppermost interlayer resin insulation layer to connect the uppermost conductive layer with the upper conductive layer or upper via conductors. Lowermost via conductors are formed in the lowermost interlayer resin insulation layer to connect the lowermost conductive layer with the lower conductive layer or lower via conductors. Diameters of the uppermost and lowermost via conductors are 30 μm to 55 μm. Covering films exposed through via-conductor openings are removed. Connection reliability is enhanced between via conductors and conductive layers.

(19) Upper solder-resist layer (70A) having openings (71A) is formed on the upper buildup layers, and lower solder-resist layer (70B) having openings (71B) is formed on the lower buildup layers (FIG. 6(B)). Thicknesses of upper and lower solder-resist layers (70A, 70B) are 5 μm to 15 μm. Upper surfaces of uppermost and lowermost conductive layers (158A, 158B) and uppermost and lowermost via conductors exposed through openings (71A, 71B) work as pads. Solder-resist layers may be formed on the upper and lower buildup layers through a layer of covering film.

(20) Nickel-plated layers (72A, 72B) are formed on pads, and gold-plated layers (74A, 74B) are further formed on nickel-plated layers 72 (FIG. 6(C)). Nickel-palladium-gold layers may also be formed instead of nickel-gold layers.

(21) Solder balls are loaded in openings (71A, 71B) and a reflow is conducted so that solder bumps (76U) are formed on the upper buildup layers, and solder bumps (76D) are formed on the lower buildup layers. Printed wiring board 10 with solder bumps is completed (FIG. 7). A semiconductor element is mounted on a printed wiring board of the embodiment through solder bumps (76U). Also, the printed wiring board of the embodiment is mounted on a motherboard through solder bumps (76D).

EXAMPLE 1

FIGS. 1~6 show a method for manufacturing printed wiring board 10 in Example 1.

(1) Double-sided copper-clad laminate (20A) is prepared as a starting material. Insulative substrate 20 of the double-sided copper-clad laminate is made of glass cloth (reinforcing material) that is made of T-glass, resin such as epoxy resin and silica particles. Thicknesses of copper foils of the double-sided copper-clad laminate are 3 μm (FIG. 1(A)). The insulative substrate has first surface (F) and second surface (S) opposite the first surface. Nitto Boseki Co., Ltd. sells glass cloth made of T-glass. The thermal expansion coefficient of glass cloth made of T-glass is approximately 3 ppm. The thickness of insulative substrate 20 is 100 μm. The amount (vol. %) of reinforcing material contained in the insulative substrate is 30 vol. %.

(2) Using a CO2 laser from the first-surface (F) side of insulative substrate 20, first openings (28a) are formed on the first-surface (F) side of double-sided copper-clad laminate (20A) (FIG. 1(B)).

(3) Using a CO2 laser from the second-surface (S) (lower-surface) side of insulative substrate 20, second openings (28b) are formed on the second-surface (S) side of double-sided copper-clad laminate (20A) (FIG. 1(C)). Penetrating holes 28 are formed by connecting first openings (28a) and second openings (28b) in the insulative substrate. Next, the double-sided copper-clad laminate having penetrating holes 28 is immersed in a solution containing permanganic acid at a predetermined concentration to conduct desmearing. At that time, the amount of weight reduction of insulative substrate 20 is 0.5 wt. % to 1.0 wt. %.

(4) Electroless copper plating is performed to form seed layers 22 made of electroless copper-plating on both surfaces of the double-sided copper-clad laminate and on the inner walls of penetrating holes. Electrolytic copper-plated films 32 are formed on seed layers 22. Penetrating holes 28 are filled with electrolytic copper-plated film (FIG. 1(E)). Film thicknesses of the electrolytic copper-plated films are reduced through mechanical polishing and etching.

(5) Etching resists 40 with a predetermined pattern are formed on electrolytic copper-plated films 32 (FIG. 2(A)).

(6) Electroless copper-plated films 22, electrolytic copper-plated films 32 and copper foils exposed from etching resists 40 are removed (FIG. 2(B)).

(7) Etching resists 40 are removed. Accordingly, first conductive layer (34A) is formed on first surface (F) of insulative substrate 20, and second conductive layer (34B) is formed on second surface (S) of insulative substrate 20 (FIG. 2(C)). First conductive layer (34A) and second conductive layer (34B) are connected by through-hole conductors 36 in penetrating holes 28. Thicknesses of first conductive layer (34A) and second conductive layer (34B) are 5 μm (FIG. 2(D)). A core substrate is completed.

(8) A covering film made by sputtering SiN is formed on first surface (F) of insulative substrate 20, first conductive layer (34A) and through-hole conductors. In the same manner, covering film 33 is formed on second surface (S) of insulative substrate 20, second conductive layer (34B) and through-hole conductors (FIG. 3(A)). Thicknesses of covering films 33 are 0.3 μm.

Figure 12:
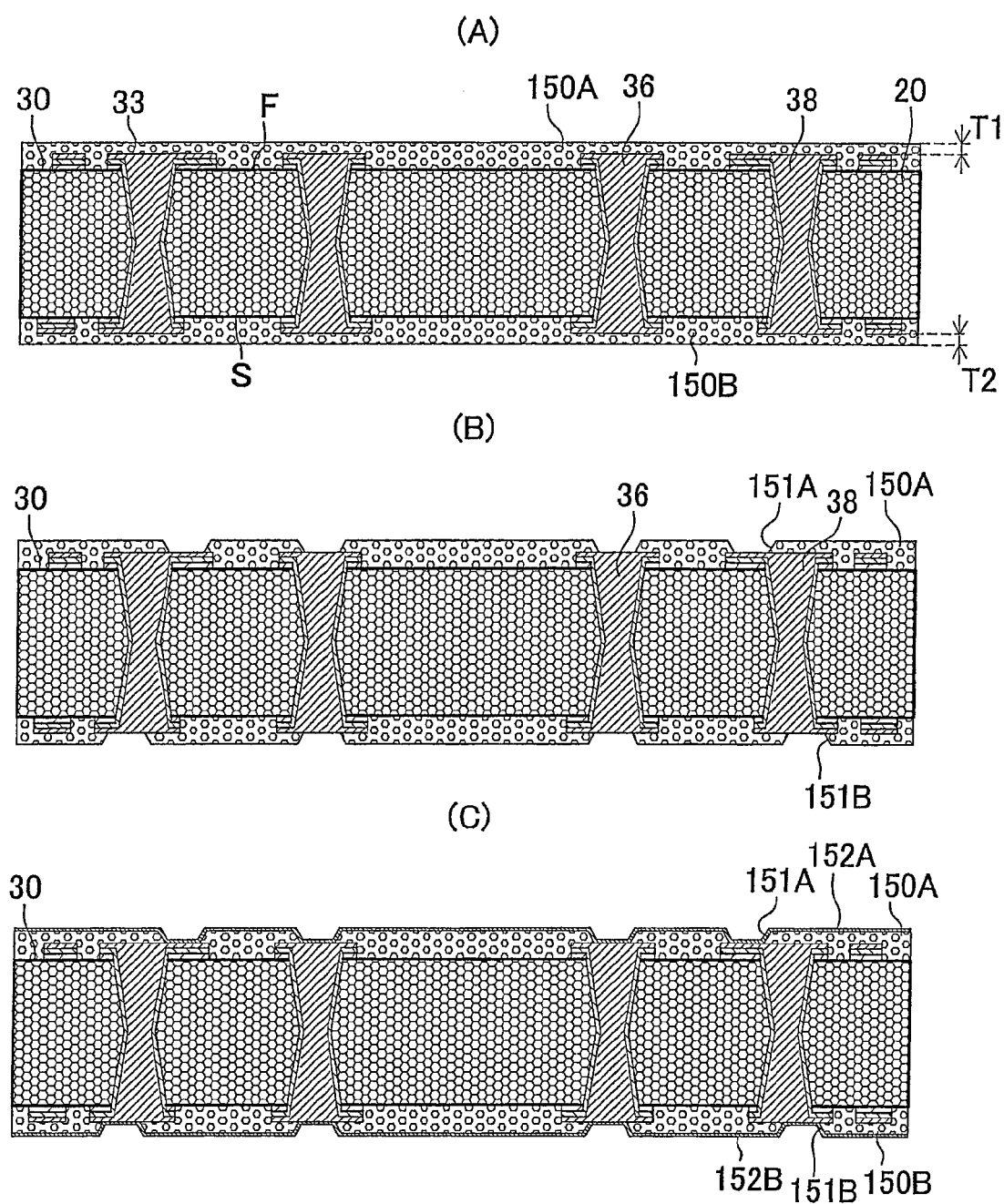
FIGS. 12(A)-(C) are views showing steps of a method for manufacturing a printed wiring board in Example 1.

(9) Uppermost and lowermost interlayer resin insulation layers (150A, 150B) are formed on both surfaces (F, S) of core substrate 30 through a layer of covering film 33 (FIG. 12(A)). Thicknesses (T1, T2) of interlayer resin insulation layers are 10 μm. Uppermost and lowermost interlayer resin insulation layers contain silica particles but not reinforcing material.

(10) Next, using a CO2 gas laser, via-conductor openings (151A, 151B) are formed respectively in interlayer resin insulation layers (150A, 150B) (FIG. 12(B)). Sizes of via-conductor openings (151A, 151B) are 45 μm (FIG. 12(B)).

(11) Electroless copper-plated films (152A, 152B) are formed on interlayer resin insulation layers (150A, 150B) and in openings (151A, 151B) (FIG. 12(C)).

(12) Plating resists 154 are formed on electroless copper-plated films 152 (FIG. 13(A)).

(13) Electrolytic copper-plated films (156A, 156B) are formed on electroless copper-plated films (152A, 152B) exposed from plating resists 154 (FIG. 13(B)).

(14) Plating resists 154 are removed. Uppermost and lowermost conductive layers (158A, 158B) and uppermost and lowermost via conductors (160A, 160B) are formed by etching away electroless copper-plated films between portions of electrolytic copper-plated films. Thicknesses of uppermost and lowermost conductive layers (158A, 158B) are 5 μm (FIG. 13(C)). Upper and lower buildup layers are completed.

(15) Upper solder-resist layer (70A) having openings (71A) is formed on the upper buildup layer, and lower solder-resist layer (70B) having openings (71B) is formed on the lower buildup layer (FIG. 14A)). Thicknesses of upper and lower solder-resist layers (70A, 70B) are 10 μm. Upper surfaces of uppermost and lowermost conductive layers (158A, 158B) and uppermost and lowermost via conductors exposed through openings (71A, 71B) work as pads. Upper and lower solder-resist layers contain silica particles but not reinforcing material. Printed wiring board 10 is completed (FIG. 14(A)).

(16) Nickel-plated layers (72A, 72B) are formed on the pads, and gold-plated layers (74A, 74B) are further formed on nickel-plated layers 72 (FIG. 14(B)).

(17) Solder balls are loaded in openings (71A, 71B) and a reflow is conducted to form solder bumps (76U) on the upper buildup layers and solder bumps (76D) on the lower buildup layers (FIG. 14(C)). The size of the printed wiring board is 15 mm square. The thickness of the printed wiring board is 0.15 mm. The percentage of the volume (vol. %) of reinforcing material such as glass cloth contained in the volume of the printed wiring board is 20 vol. %. The size of the insulative substrate is the same as that of the printed wiring board. The volume of a printed wiring board in the embodiment and examples is obtained by multiplying the size of a printed wiring board by the thickness of the printed wiring board.

EXAMPLE 2

A printed wiring board of Example 2 is manufactured in the same manner as Example 1 except for the following:
The amount (vol. %) of reinforcing material in the insulative substrate is 45%. The amount (vol. %) of reinforcing material in the printed wiring board is 30%.

EXAMPLE 3

A printed wiring board of Example 3 is manufactured in the same manner as Example 1 except for the following:
The amount (vol. %) of reinforcing material in the insulative substrate is 52.5%. The amount (vol. %) of reinforcing material in the printed wiring board is 35%.

EXAMPLE 4

A printed wiring board of Example 4 is manufactured in the same manner as Example 1 except for the following:
The thickness of the insulative substrate is 115 μm, and the amount (vol. %) of reinforcing material in the insulative substrate is 29.4%. Thicknesses of conductive layers in the core substrate and buildup layers are 7 μm. The thickness of the printed wiring board is 169 μm. The amount (vol. %) of reinforcing material in the printed wiring board is 20%.

EXAMPLE 5

A printed wiring board of Example 5 is manufactured in the same manner as Example 4 except for the following:
The amount (vol. %) of reinforcing material in the insulative substrate is 44.1%. The amount (vol. %) of reinforcing material in the printed wiring board is 30%.

EXAMPLE 6

A printed wiring board of Example 6 is manufactured in the same manner as Example 4 except for the following:

The amount (vol. %) of reinforcing material in the insulative substrate is 51.4%. The amount (vol. %) of reinforcing material in the printed wiring board is 35%.

EXAMPLE 7

A printed wiring board of Example 7 is manufactured in the same manner as Example 1 except for the following:

The thickness of the insulative substrate is 100 µm, and the amount (vol. %) of reinforcing material in the insulative substrate is 51.2%. Thicknesses of conductive layers in the core substrate and buildup layers are 13 µm. Thicknesses of interlayer resin insulation layers are 20 p.m. Thicknesses of solder-resist layers are 15 µm. The thickness of the printed wiring board is 256 µm. The amount (vol. %) of reinforcing material in the printed wiring board is 20%.

EXAMPLE 8

A printed wiring board of Example 8 is manufactured in the same manner as Example 7 except for the following:

The amount (vol. %) of reinforcing material in the insulative substrate is 76.8%. The amount (vol. %) of reinforcing material in the printed wiring board is 30%.

EXAMPLE 9

A printed wiring board of Example 9 is manufactured in the same manner as Example 7 except for the following:

The amount (vol. %) of reinforcing material in the insulative substrate is 89.6%. The amount (vol. %) of reinforcing material in the printed wiring board is 35%.

EXAMPLE 10

A printed wiring board of Example 10 is manufactured in the same manner as Example 1 except for the following:

The thickness of the insulative substrate is 150 µm, and the amount (vol. %) of reinforcing material in the insulative substrate is 40.8%. Thicknesses of conductive layers in the core substrate and buildup layers are 13 µm. Thicknesses of interlayer resin insulation layers are 20 µm. Thicknesses of solder-resist layers are 15 µm. The thickness of the printed wiring board is 306 p.m. The amount (vol. %) of reinforcing material in the printed wiring board is 20%.

EXAMPLE 11

A printed wiring board of Example 11 is manufactured in the same manner as Example 10 except for the following:

The amount (vol. %) of reinforcing material in the insulative substrate is 61.2%. The amount (vol. %) of reinforcing material in the printed wiring board is 30%.

EXAMPLE 12

A printed wiring board of Example 12 is manufactured in the same manner as Example 10 except for the following:

The amount (vol. %) of reinforcing material in the insulative substrate is 71.4%. The amount (vol. %) of reinforcing material in the printed wiring board is 35%.

EXAMPLE 13

A printed wiring board of Example 13 is manufactured in the same manner as Example 1 except for the following:

The thickness of the insulative substrate is 250 µm, and the amount (vol. %) of reinforcing material in the insulative substrate is 22.4%. Thicknesses of interlayer resin insulation layers are 5 µm. Thicknesses of solder-resist layers are 5 µm. The thickness of the printed wiring board is 280 µm. The amount (vol. %) of reinforcing material in the printed wiring board is 20%.

EXAMPLE 14

A printed wiring board of Example 14 is manufactured in the same manner as Example 13 except for the following:

The amount (vol. %) of reinforcing material in the insulative substrate is 33.6%. The amount (vol. %) of reinforcing material in the printed wiring board is 30%.

EXAMPLE 15

A printed wiring board of Example 15 is manufactured in the same manner as Example 13 except for the following:

The amount (vol. %) of reinforcing material in the insulative substrate is 39.2%. The amount (vol. %) of reinforcing material in the printed wiring board is 35%.

EXAMPLE 16

A printed wiring board of Example 16 is manufactured in the same manner as Example 1 except for the following:

The thickness of the insulative substrate is 250 µm, and the amount (vol. %) of reinforcing material in the insulative substrate is 27.7%. Thicknesses of conductive layers in the core substrate and buildup layers are 13 µm. Thicknesses of interlayer resin insulation layers are 20 µm. Thicknesses of solder-resist layers are 15 The thickness of the printed wiring board is 346 µm. The amount (vol. %) of reinforcing material in the printed wiring board is 20%.

EXAMPLE 17

A printed wiring board of Example 17 is manufactured in the same manner as Example 16 except for the following:

The amount (vol. %) of reinforcing material in the insulative substrate is 41.5%. The amount (vol. %) of reinforcing material in the printed wiring board is 30%.

EXAMPLE 18

A printed wiring board of Example 18 is manufactured in the same manner as Example 16 except for the following:

The amount (vol. %) of reinforcing material in the insulative substrate is 48.4%. The amount (vol. %) of reinforcing material in the printed wiring board is 35%.

EXAMPLE 19

A printed wiring board of Example 19 is manufactured in the same manner as Example 1 except for the following:

The thickness of the insulative substrate is 290 µm, and the amount (vol. %) of reinforcing material in the insulative substrate is 24.8%. Thicknesses of conductive layers in the core substrate and buildup layers are 10 µm. Thicknesses of solder-resist layers are 15 µm. The thickness of the printed wiring board is 360 µm. The amount (vol. %) of reinforcing material in the printed wiring board is 20%.

EXAMPLE 20

A printed wiring board of Example 20 is manufactured in the same manner as Example 19 except for the following:

The amount (vol. %) of reinforcing material in the insulative substrate is 37.2%. The amount (vol. %) of reinforcing material in the printed wiring board is 30%.

EXAMPLE 21

A printed wiring board of Example 21 is manufactured in the same manner as Example 19 except for the following:
The amount (vol. %) of reinforcing material in the insulative substrate is 43.4%. The amount (vol. %) of reinforcing material in the printed wiring board is 35%.

EXAMPLE 22

A printed wiring board of Example 22 is manufactured in the same manner as Example 1 except for the following:
The thickness of the insulative substrate is 290 μm, and the amount (vol. %) of reinforcing material in the insulative substrate is 26.2%. Thicknesses of conductive layers in the core substrate and buildup layers are 10 μm. Thicknesses of interlayer resin insulation layers are 20 μm. Thicknesses of solder-resist layers are 15 μm. The thickness of the printed wiring board is 380 μm. The amount (vol. %) of reinforcing material in the printed wiring board is 20%.

EXAMPLE 23

A printed wiring board of Example 23 is manufactured in the same manner as Example 22 except for the following:
The amount (vol. %) of reinforcing material in the insulative substrate is 39.3%. The amount (vol. %) of reinforcing material in the printed wiring board is 30%.

EXAMPLE 24

A printed wiring board of Example 24 is manufactured in the same manner as Example 22 except for the following:
The amount (vol. %) of reinforcing material in the insulative substrate is 45.9%. The amount (vol. %) of reinforcing material in the printed wiring board is 35%.

EXAMPLE 25

FIGS. 1~6 show a method for manufacturing printed wiring board 10 in Example 25.
(1) Double-sided copper-clad laminate (20A) is prepared as a starting material. Insulative substrate 20 of the double-sided copper-clad laminate is made of glass cloth (reinforcing material) of E-glass, resin such as epoxy resin and silica particles. Thicknesses of copper foils of the double-sided copper-clad laminate are 3 μm (FIG. 1(A)). The insulative substrate has first surface (F) and second surface (S) opposite the first surface. Nitto Boseki Co., Ltd. sells glass cloth made of E-glass. The thermal expansion coefficient of glass cloth made of E-glass is approximately 6 ppm. Thickness (T0) of insulative substrate 20 is 75 μm. The amount (vol. %) of reinforcing material contained in the insulative substrate is 40 vol. %.
(2) Using a CO2 laser from the first-surface (F) side of insulative substrate 20, first openings (28a) are formed on the first-surface (F) side of double-sided copper-clad laminate (20A) (FIG. 1(B)).
(3) Using a CO2 laser from the second-surface (S) (lower-surface) side of insulative substrate 20, second openings (28b) are formed on the second-surface (S) side of double-sided copper-clad laminate (20A) (FIG. 1(C)). Penetrating holes 28 are formed by connecting first openings (28a) and second openings (28b) in the insulative substrate. Next, the double-sided copper-clad laminate having penetrating holes 28 is immersed in a solution containing permanganic acid at a predetermined concentration to conduct desmearing. At that time, the amount of weight reduction of insulative substrate 20 is 0.5 wt. % to 1.0 wt. %.
(4) Electroless copper plating is performed to form seed layers 22 made of electroless copper plating on both surfaces of the double-sided copper-clad laminate and on the inner walls of penetrating holes (FIG. 1(D)). Electrolytic copper-plated films 32 are formed on seed layers 22. Penetrating holes 28 are filled with electrolytic copper-plated film (FIG. 1(E)). Film thicknesses of the electrolytic copper-plated films are reduced through mechanical polishing and etching.
(5) Etching resists 40 with a predetermined pattern are formed on electrolytic copper-plated films 32 (FIG. 2(A)).
(6) Electroless copper-plated films 22, electrolytic copper-plated films 32 and copper foils exposed from etching resists 40 are removed (FIG. 2(B)).
(7) Etching resists 40 are removed. Accordingly, first conductive layer (34A) is formed on first surface (F) of insulative substrate 20, and second conductive layer (34B) is formed on second surface (S) of insulative substrate 20 (FIG. 2(C)). First conductive layer (34A) and second conductive layer (34B) are connected by through-hole conductors 36 in penetrating holes 28. Thicknesses of first conductive layer (34A) and second conductive layer (34B) are 7.5 μm (FIG. 2(D)). A core substrate is completed.
(8) Covering film 33 made by sputtering SiN is formed on first surface (F), first conductive layer (34A) and through-hole conductors of insulative substrate 20. In the same manner, covering film 33 is formed on second surface (S) of insulative substrate 20, second conductive layer (34B) and through-hole conductors (FIG. 3(A)). Thicknesses of the covering films are 0.3 μm.
(9) Upper and lower interlayer resin insulation layers (50A, 50B) are formed on both surfaces (F, S) of core substrate 30 through a layer of covering film 33 (FIG. 3(B)). Thicknesses (T1, T2) of interlayer resin insulation layers are 7.5 μm. Upper and lower interlayer resin insulation layers contain silica particles but not reinforcing material.
(10) Next, using a CO2 gas laser, via-conductor openings (51A, 51B) are formed respectively in interlayer resin insulation layers (50A, 50B) (FIG. 3(C)). Sizes of via-conductor openings (51A, 51B) are 45 μm (FIG. 10).
(11) Electroless copper-plated films (52A, 52B) are formed on interlayer resin insulation layers (50A, 50B) and in openings (51A, 51B) (FIG. 3(D)).
(12) Plating resists 54 are formed on electroless copper-plated films 52 (FIG. 4(A)).
(13) Electrolytic copper-plated films (56A, 56B) are formed on electroless copper-plated films 52 exposed from plating resists 54 (FIG. 4(B)).
(14) Plating resists 54 are removed. Upper and lower conductive layers (58A, 58B) and upper and lower via conductors (60A, 60B) are formed by etching away electroless copper-plated films between portions of electrolytic copper-plated films. Thicknesses of upper and lower conductive layers (58A, 58B) are 7.5 μm (FIG. 5(A)).
(15) Covering film 130 made by sputtering SiN is formed on the upper interlayer resin insulation layer, upper conductive layer and upper via conductors. In the same manner, covering film 130 is formed on the lower interlayer resin insulation layer, lower conductive layer and lower via conductors (FIG. 5(B)). Thicknesses of the covering films are 0.3 μm.

(16) An uppermost interlayer resin insulation layer is formed on the upper interlayer resin insulation layer, upper conductive layer and upper via conductors through a layer of covering film. A lowermost interlayer resin insulation layer is formed on the lower interlayer resin insulation layer, lower conductive layer and lower via conductors through a layer of covering film. Thicknesses of the uppermost and lowermost interlayer resin insulation layers are 7.5 μm.

(17) Procedures from (10) to (15) in Example 25 are conducted. Uppermost and lowermost conductive layers along with uppermost and lowermost via conductors are formed. Thicknesses of the uppermost and lowermost conductive layers are 7.5 μm. Upper and lower buildup layers are completed.

(18) Upper solder-resist layer (70A) having openings (71A) is formed on the upper buildup layer, and lower solder-resist layer (70B) having openings (71B) is formed on the lower buildup layer (FIG. 6(B)). Thicknesses of upper and lower solder-resist layers (70A, 70B) are 7.5 μm. Upper surfaces of uppermost and lowermost conductive layers (158A, 158B) and uppermost and lowermost via conductors exposed through openings (71A, 71B) work as pads. Upper and lower solder-resist layers contain silica particles but not reinforcing material.

(19) Nickel-plated layers (72A, 72B) are formed on the pads, and gold-plated layers (74A, 74B) are further formed on nickel-plated layers 72 (FIG. 6(C)).

(20) Solder balls are loaded in openings (71A, 71B) and a reflow is conducted to form solder bumps (76U) on the upper buildup layers and solder bumps (76D) on the lower buildup layers (FIG. 7). The size of the printed wiring board is 15 mm square. The thickness of the printed wiring board is 0.15 mm. The percentage of the volume (vol. %) of reinforcing material such as glass cloth contained in the volume of the printed wiring board is 20 vol. %.

EXAMPLE 26

A printed wiring board of Example 26 is manufactured in the same manner as Example 25 except for the following:
The amount (vol. %) of reinforcing material in the insulative substrate is 60%. The amount (vol. %) of reinforcing material in the printed wiring board is 30%.

EXAMPLE 27

A printed wiring board of Example 27 is manufactured in the same manner as Example 25 except for the following:
The amount (vol. %) of reinforcing material in the insulative substrate is 70%. The amount (vol. %) of reinforcing material in the printed wiring board is 35%.

EXAMPLE 28

A printed wiring board of Example 28 is manufactured in the same manner as Example 25 except for the following:
The thickness of the insulative substrate is 100 μm, and the amount (vol. %) of reinforcing material in the insulative substrate is 30%. Thicknesses of conductive layers in the core substrate and buildup layers are 5 μm. Thicknesses of interlayer resin insulation layers are 5 μm. Thicknesses of solder-resist layers are 5 μm. The thickness of the printed wiring board is 150 μm. The amount (vol. %) of reinforcing material in the printed wiring board is 20%.

EXAMPLE 29

A printed wiring board of Example 29 is manufactured in the same manner as Example 28 except for the following:
The amount (vol. %) of reinforcing material in the insulative substrate is 45%. The amount (vol. %) of reinforcing material in the printed wiring board is 30%.

EXAMPLE 30

A printed wiring board of Example 30 is manufactured in the same manner as Example 28 except for the following:
The amount (vol. %) of reinforcing material in the insulative substrate is 52.5%. The amount (vol. %) of reinforcing material in the printed wiring board is 35%.

EXAMPLE 31

A printed wiring board of Example 31 is manufactured in the same manner as Example 25 except for the following:
The thickness of the insulative substrate is 100 μm, and the amount (vol. %) of reinforcing material in the insulative substrate is 52.4%. Thicknesses of conductive layers in the core substrate and buildup layers are 13 μm. Thicknesses of interlayer resin insulation layers are 20 μm. Thicknesses of solder-resist layers are 15 μm. The thickness of the printed wiring board is 262 μm. The amount (vol. %) of reinforcing material in the printed wiring board is 20%.

EXAMPLE 32

A printed wiring board of Example 32 is manufactured in the same manner as Example 31 except for the following:
The amount (vol. %) of reinforcing material in the insulative substrate is 78.6%. The amount (vol. %) of reinforcing material in the printed wiring board is 30%.

EXAMPLE 33

A printed wiring board of Example 33 is manufactured in the same manner as Example 31 except for the following:
The amount (vol. %) of reinforcing material in the insulative substrate is 91.7%. The amount (vol. %) of reinforcing material in the printed wiring board is 35%.

EXAMPLE 34

A printed wiring board of Example 34 is manufactured in the same manner as Example 25 except for the following:
The thickness of the insulative substrate is 190 μm, and the amount (vol. %) of reinforcing material in the insulative substrate is 31.6%. Thicknesses of conductive layers in the core substrate and buildup layers are 10 μm. Thicknesses of interlayer resin insulation layers are 10 μm. Thicknesses of solder-resist layers are 15 μm. The thickness of the printed wiring board is 300 μm. The amount (vol. %) of reinforcing material in the printed wiring board is 20%.

EXAMPLE 35

A printed wiring board of Example 35 is manufactured in the same manner as Example 34 except for the following:
The amount (vol. %) of reinforcing material in the insulative substrate is 47.4%. The amount (vol. %) of reinforcing material in the printed wiring board is 30%.

EXAMPLE 36

A printed wiring board of Example 36 is manufactured in the same manner as Example 34 except for the following:

The amount (vol. %) of reinforcing material in the insulative substrate is 55.3%. The amount (vol. %) of reinforcing material in the printed wiring board is 35%.

EXAMPLE 37

A printed wiring board of Example 37 is manufactured in the same manner as Example 25 except for the following:

The thickness of the insulative substrate is 190 μm, and the amount (vol. %) of reinforcing material in the insulative substrate is 35.8%. Thicknesses of conductive layers in the core substrate and buildup layers are 10 μm. Thicknesses of interlayer resin insulation layers are 20 μm. Thicknesses of solder-resist layers are 15 μm. The thickness of the printed wiring board is 300 μm. The amount (vol. %) of reinforcing material in the printed wiring board is 20%.

EXAMPLE 38

A printed wiring board of Example 38 is manufactured in the same manner as Example 37 except for the following:

The amount (vol. %) of reinforcing material in the insulative substrate is 53.7%. The amount (vol. %) of reinforcing material in the printed wiring board is 30%.

EXAMPLE 39

A printed wiring board of Example 39 is manufactured in the same manner as Example 37 except for the following:

The amount (vol. %) of reinforcing material in the insulative substrate is 62.6%. The amount (vol. %) of reinforcing material in the printed wiring board is 35%.

EXAMPLE 40

A printed wiring board of Example 40 is manufactured in the same manner as Example 25 except for the following:

The thickness of the insulative substrate is 250 μm, and the amount (vol. %) of reinforcing material in the insulative substrate is 30.4%. Thicknesses of conductive layers in the core substrate and buildup layers are 13 μm. Thicknesses of interlayer resin insulation layers are 13 μm. Thicknesses of solder-resist layers are 13 μm. The thickness of the printed wiring board is 380 μm. The amount (vol. %) of reinforcing material in the printed wiring board is 20%.

EXAMPLE 41

A printed wiring board of Example 41 is manufactured in the same manner as Example 40 except for the following:

The amount (vol. %) of reinforcing material in the insulative substrate is 45.6%. The amount (vol. %) of reinforcing material in the printed wiring board is 30%.

EXAMPLE 42

A printed wiring board of Example 42 is manufactured in the same manner as Example 40 except for the following:

The amount (vol. %) of reinforcing material in the insulative substrate is 53.2%. The amount (vol. %) of reinforcing material in the printed wiring board is 35%.

EXAMPLE 43

A printed wiring board of Example 43 is manufactured in the same manner as Example 25 except for the following:

The thickness of the insulative substrate is 250 μm, and the amount (vol. %) of reinforcing material in the insulative substrate is 30.4%. Thicknesses of conductive layers in the core substrate and buildup layers are 10 μm. Thicknesses of interlayer resin insulation layers are 15 μm. Thicknesses of solder-resist layers are 15 μm. The thickness of the printed wiring board is 380 μm. The amount (vol. %) of reinforcing material in the printed wiring board is 20%.

EXAMPLE 44

A printed wiring board of Example 44 is manufactured in the same manner as Example 43 except for the following:

The amount (vol. %) of reinforcing material in the insulative substrate is 45.6%. The amount (vol. %) of reinforcing material in the printed wiring board is 30%.

EXAMPLE 45

A printed wiring board of Example 45 is manufactured in the same manner as Example 43 except for the following:

The amount (vol. %) of reinforcing material in the insulative substrate is 53.2%. The amount (vol. %) of reinforcing material in the printed wiring board is 35%.

EXAMPLE 46

A printed wiring board of Example 46 is manufactured in the same manner as Example 25 except for the following:

The thickness of the insulative substrate is 230 μm, and the amount (vol. %) of reinforcing material in the insulative substrate is 31.3%. Thicknesses of conductive layers in the core substrate and buildup layers are 10 μm. Thicknesses of interlayer resin insulation layers are 15 μm. Thicknesses of solder-resist layers are 15 μm. The thickness of the printed wiring board is 360 μm. The amount (vol. %) of reinforcing material in the printed wiring board is 20%.

EXAMPLE 47

A printed wiring board of Example 47 is manufactured in the same manner as Example 46 except for the following:

The amount (vol. %) of reinforcing material in the insulative substrate is 47%. The amount (vol. %) of reinforcing material in the printed wiring board is 30%.

EXAMPLE 48

A printed wiring board of Example 48 is manufactured in the same manner as Example 46 except for the following:

The amount (vol. %) of reinforcing material in the insulative substrate is 54.8%. The amount (vol. %) of reinforcing material in the printed wiring board is 35%.

The amount of warping and direction of warping in each example are projected by inputting the following in a software: thickness of the insulative substrate, thickness of the printed wiring board, thickness of conductive layers, thickness of interlayer resin insulation layers, thickness of solder-resist layers and amount of reinforcing material in the printed wiring board.

The printed wiring board shown in FIG. 11(A) shows warping in the plus (+) direction, and the printed wiring board shown in FIG. 11(B) shows warping in the minus (−) direction. When an IC chip is mounted on a printed wiring board, the amount of warping (WA) of the printed wiring board with a mounted IC chip is projected. The amounts of warping (WA) are shown in FIGS. 11(A) and 11(B).

FIG. 15 is a summary of the projected amounts of warping and directions of warping. When the projected amount of warping is 100 μm or less, "B" is assigned; and when it is 80 or less, "A" is assigned. "A" is better than "B." Directions of warping in FIG. 15 are described using Examples 1 and 13. The direction of warping in Example 1 is plus (+). When multiple printed wiring boards are manufactured by the same method as in Example 1, the direction of warping in each printed wiring board is projected to be in the plus direction.

The direction of warping in Example 13 may be plus (+) or minus (−). When multiple printed wiring boards are manufactured by the same method as in Example 13, it is projected that the printed wiring board shown in FIG. 11(A) and the printed wiring board shown in FIG. 11(B) are both observed. When plus (+) direction and minus (−) direction coexist, it is difficult to mount IC chips. Also, it is more difficult to mount those printed wiring boards on motherboards during second mounting.

In printed wiring boards of Examples 7, 10 and 31, since the volume of a core substrate that occupies a printed wiring board is small, warping is considered to be great.

In printed wiring boards of Examples 13, 19 and 22, since the volume of a core substrate that occupies a printed wiring board is great, it is considered difficult to control the direction of a printed wiring board using reinforcing material.

A printed wiring board according to an embodiment of the present invention has the following: a core substrate formed with an insulative substrate having a first surface and a second surface opposite the first surface, a first conductive layer formed on the first surface of the insulative substrate, a second conductive layer formed on the second surface of the insulative substrate, and a through-hole conductor penetrating through the insulative substrate and connecting the first conductive layer and the second conductive layer; upper buildup layers which are laminated on the first surface of the insulative substrate and on the first conductive layer, and which are formed with an uppermost interlayer resin insulation layer, an uppermost conductive layer on the uppermost interlayer resin insulation layer, and an uppermost via conductor formed in the uppermost interlayer resin insulation layer and electrically connecting the uppermost conductive layer and the first conductive layer; lower buildup layers which are laminated on the second surface of the insulative substrate and on the second conductive layer, and which are formed with a lowermost interlayer resin insulation layer, a lowermost conductive layer on the lowermost interlayer resin insulation layer, and a lowermost via conductor formed in the lowermost interlayer resin insulation layer and electrically connecting the lowermost conductive layer and the second conductive layer; an upper solder-resist layer formed on the upper buildup layers; and a lower solder-resist layer formed on the lower buildup layers. In such a printed wiring board, the thickness of the printed wiring board is set at 150 μm or greater but less than 380 μm, and the printed wiring board contains reinforcing material from 20 vol. % to 35 vol. %.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate;
a plurality of buildup structures including a first buildup structure formed on a first surface of the core substrate and a second buildup structure formed on a second surface of the core substrate on an opposite side of the first surface of the core substrate with respect to the first surface of the core substrate; and
a plurality of solder-resist layers including a first solder-resist layer formed on the first buildup structure and a second solder-resist layer formed on the second buildup structure,
wherein the core substrate includes an insulative substrate including reinforcing material, a first conductive layer formed on a first surface of the insulative substrate, a second conductive layer formed on a second surface of the insulative substrate, and a through-hole conductor penetrating through the insulative substrate and connecting the first conductive layer and the second conductive layer, the first buildup structure includes an outermost interlayer resin insulation layer and an outermost conductive layer formed on the outermost interlayer resin insulation layer in the first buildup structure, the second buildup structure includes an outermost interlayer resin insulation layer and an outermost conductive layer formed on the outermost interlayer resin insulation layer in the second buildup structure, the insulative substrate of the core substrate has a thickness in a range of 75 μm to 290 μm, a thickness between an outer surface of the first solder-resist layer and an outer surface of the second solder-resist layer is set in a range of from 150 μm or greater and less than 380 μm, the insulative substrate includes the reinforcing material such that the printed wiring board includes the reinforcing material in an amount in a range of from 20 vol. % to 35 vol. %, the first and second buildup structures do not contain the reinforcing material, and the first and the second solder-resist layers do not contain the reinforcing material.

2. The printed wiring board according to claim 1, wherein the reinforcing material is a glass cloth.

3. The printed wiring board according to claim 1, wherein the insulative substrate has a thickness which has a ratio of 2/3 or greater but 3/4 or smaller as divided by the thickness between the outer surface of the first solder-resist layer and the outer surface of the second solder-resist layer.

4. The printed wiring board according to claim 1, wherein the first buildup structure includes a plurality of interlayer resin insulation layers including the outermost interlayer resin insulation layer in the first buildup structure, the second buildup structure includes a plurality of interlayer resin insulation layers including the outermost interlayer resin insulation layer in the second buildup structure, and the insulative substrate has a thickness which has a ratio of 1/2 or greater but 2/3 or smaller as divided by the thickness between the outer surface of the first solder-resist layer and the outer surface of the second solder-resist layer.

5. The printed wiring board according to claim 1, wherein the outermost conductive layer in the first buildup structure has a thickness in a range of 5 μm to 13 μm, the outermost conductive layer in the second buildup structure has a thickness in a range of 5 μm to 13 μm, the outermost interlayer resin insulation layer in the first buildup structure has a thickness in a range of 5 μm to 20 μm, the outermost interlayer resin insulation layer in the second buildup structure has a thickness in a range of 5 μm to 20 μm, the first solder-resist layer has a thickness in a range of 5 μm to 15 μm, and the second solder-resist layer has a thickness in a range of 5 μm to 15 μm.

6. The printed wiring board according to claim 5, wherein the outermost conductive layer in the first buildup structure has a thickness in a range of 10 μm or less, and the outermost conductive layer in the second buildup structure has a thickness in a range of 10 μm or less.

7. The printed wiring board according to claim 6, wherein the outermost interlayer resin insulation layer in the first buildup structure has a thickness in a range of 13 μm or less, and the outermost interlayer resin insulation layer in the second buildup structure has a thickness in a range of 13 μm or less.

8. The printed wiring board according to claim 5, wherein the outermost conductive layer in the first buildup structure has a thickness which has a ratio of 0.5 to 0.9 as divided by a thickness of the interlayer resin insulation layer in the first buildup structure, and the outermost conductive layer in the second buildup structure has a thickness which has a ratio of 0.5 to 0.9 as divided by a thickness of the interlayer resin insulation layer in the second buildup structure.

9. The printed wiring board according to claim 5, wherein the first solder-resist layer has a thickness which has a ratio of 0.9 to 1.1 as divided by a thickness of the outermost interlayer resin insulation layers in the first buildup structure, and the second solder-resist layer has a thickness which has a ratio of 0.9 to 1.1 as divided by a thickness of the outermost interlayer resin insulation layers in the second buildup structure.

10. The printed wiring board according to claim 1, wherein the first buildup structure has a via conductor formed in the outermost interlayer resin insulation layer in first buildup structure and having a diameter in a range of 30 μm to 55 μm on an outer surface of the outermost interlayer resin insulation layer in the first buildup structure, and the second buildup structure has a via conductor formed in the outermost interlayer resin insulation layer in second buildup structure and having a diameter in a range of 30 μm to 55 μm on an outer surface of the outermost interlayer resin insulation layer in the second buildup structure.

11. The printed wiring board according to claim 1, wherein the reinforcing material has a thermal expansion coefficient of 6 ppm or lower.

12. The printed wiring board according to claim 1, wherein the first buildup structure includes a via conductor formed in the outermost interlayer resin insulation layer in the first buildup structure and connecting the outermost conductive layer in the first buildup structure and the first conductive layer in the core substrate, and the second buildup structure includes a via conductor formed in the outermost interlayer resin insulation layer in the second buildup structure and connecting the outermost conductive layer in the second buildup structure and the second conductive layer in the core substrate.

13. The printed wiring board according to claim 12, wherein the reinforcing material is a glass cloth.

14. The printed wiring board according to claim 12, wherein the outermost conductive layer in the first buildup structure has a thickness in a range of 5 μm to 13 μm, the outermost conductive layer in the second buildup structure has a thickness in a range of 5 μm to 13 μm, the outermost interlayer resin insulation layer in the first buildup structure has a thickness in a range of 5 μm to 20 μm, the outermost interlayer resin insulation layer in the second buildup structure has a thickness in a range of 5 μm to 20 μm, the first solder-resist layer has a thickness in a range of 5 μm to 15 μm, and the second solder-resist layer has a thickness in a range of 5 μm to 15 μm.

15. The printed wiring board according to claim 14, wherein the outermost conductive layer in the first buildup structure has a thickness in a range of 10 μm or less, and the outermost conductive layer in the second buildup structure has a thickness in a range of 10 μm or less.

16. The printed wiring board according to claim 15, wherein the outermost interlayer resin insulation layer in the first buildup structure has a thickness in a range of 13 μm or less, and the outermost interlayer resin insulation layer in the second buildup structure has a thickness in a range of 13 μm or less.

17. The printed wiring board according to claim 12, wherein the via conductor formed in the outermost interlayer resin insulation layer in first buildup structure has a diameter in a range of 30 μm to 55 μm on an outer surface of the outermost interlayer resin insulation layer in the first buildup structure, and the via conductor formed in the outermost interlayer resin insulation layer in second buildup structure has a diameter in a range of 30 μm to 55 μm on an outer surface of the outermost interlayer resin insulation layer in the second buildup structure.

18. The printed wiring board according to claim 12, wherein the reinforcing material has a thermal expansion coefficient of 6 ppm or lower.

19. The printed wiring board according to claim 1, wherein the first buildup structure includes a plurality of pads positioned to mount a semiconductor element to the first buildup structure, and the second buildup structure includes a plurality of pads positioned to mount a motherboard to the second buildup structure.

20. The printed wiring board according to claim 12, wherein the first buildup structure includes a plurality of pads positioned to mount a semiconductor element to the first buildup structure, and the second buildup structure includes a plurality of pads positioned to mount a motherboard to the second buildup structure.

* * * * *